United States Patent
Sakai

(10) Patent No.: US 8,241,958 B2
(45) Date of Patent: Aug. 14, 2012

(54) SEMICONDUCTOR DEVICE, SEMICONDUCTOR MODULE, METHOD FOR MANUFACTURING SEMICONDUCTOR DEVICE, AND LEAD FRAME

(75) Inventor: Haruhiko Sakai, Ota (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 16 days.

(21) Appl. No.: 12/904,851

(22) Filed: Oct. 14, 2010

(65) Prior Publication Data

US 2011/0024883 A1  Feb. 3, 2011

Related U.S. Application Data

(62) Division of application No. 12/512,802, filed on Jul. 30, 2009, now Pat. No. 7,839,004.

(30) Foreign Application Priority Data

Jul. 30, 2008 (JP) ................................. 2008-195784
Jul. 30, 2008 (JP) ................................. 2008-195785

(51) Int. Cl.
*H01L 21/00* (2006.01)
(52) U.S. Cl. ........ 438/112; 438/106; 438/111; 438/123; 438/124; 257/666; 257/669; 257/674; 257/676; 257/E21.001
(58) Field of Classification Search .................. 438/112; 257/669, 674, 676, E21.001
See application file for complete search history.

(56) References Cited

U.S. PATENT DOCUMENTS

| 4,460,917 A | 7/1984 | Rogers |
| 4,641,418 A * | 2/1987 | Meddles ................... 264/272.17 |
| 4,888,307 A | 12/1989 | Spairisano et al. |
| 5,038,200 A | 8/1991 | Hosomi et al. |
| 5,233,222 A * | 8/1993 | Djennas et al. ............... 257/676 |
| 5,427,938 A | 6/1995 | Matsumura et al. |
| 5,663,104 A | 9/1997 | Fukuyama |
| 5,665,296 A * | 9/1997 | Jain et al. .................. 264/272.15 |
| 5,753,977 A * | 5/1998 | Kusaka et al. ................. 257/787 |

(Continued)

FOREIGN PATENT DOCUMENTS

JP  2001-320009  11/2001

OTHER PUBLICATIONS

Sakai, H. et al., U.S. Office Action mailed Dec. 28, 2009, directed to U.S. Appl. No. 12/512,802; 8 pages.

*Primary Examiner* — Angel Roman
(74) *Attorney, Agent, or Firm* — Morrison & Foerster LLP

(57) ABSTRACT

To provide a semiconductor device and a semiconductor module in which breakage of a semiconductor element due to a pressing force given from the outside is prevented. A semiconductor device according to the present invention has a configuration mainly including an island, a semiconductor element mounted on a front surface of the island, a lead that functions as an external connection terminal, and a sealing resin that covers these components in an integrated manner and mechanically supports them. Further, a through-hole is provided so as to penetrate the sealing resin. A front surface of the sealing resin around the through-hole forms a flat part. The front surface of the sealing resin that overlaps the semiconductor element is depressed inward with respect to the flat part to form a depressed part.

7 Claims, 17 Drawing Sheets

U.S. PATENT DOCUMENTS

| | | | |
|---|---|---|---|
| 5,766,649 A * | 6/1998 | Azuma | 425/116 |
| 5,766,985 A | 6/1998 | Mangiagli et al. | |
| 6,630,374 B2 | 10/2003 | Yamamoto | |
| 6,667,547 B2 | 12/2003 | Woodworth et al. | |
| 6,924,548 B2 * | 8/2005 | Hasebe et al. | 257/674 |
| 7,834,431 B2 * | 11/2010 | Hooper et al. | 257/667 |
| 2004/0159922 A1 * | 8/2004 | Miyaki et al. | 257/676 |
| 2005/0051876 A1 * | 3/2005 | Manalac et al. | 257/666 |
| 2006/0263940 A1 * | 11/2006 | Ng et al. | 438/111 |
| 2006/0278961 A1 * | 12/2006 | Gai | 257/667 |
| 2008/0237816 A1 * | 10/2008 | Bathan et al. | 257/670 |

* cited by examiner

SEMICONDUCTOR DEVICE, SEMICONDUCTOR MODULE, METHOD FOR MANUFACTURING SEMICONDUCTOR DEVICE, AND LEAD FRAME

This application claims priority from Japanese Patent Application Number JP 2008-195784 filed on Jul. 30, 2008, and Japanese Patent Application Number JP 2008-195785 filed on Jul. 30, 2008, the contents of which are incorporated herein by reference in their entirety. This application is a divisional of U.S. Ser. No. 12/512,802, filed Jul. 30, 2009, now U.S. Pat. No. 7,839,004.

BACKGROUND OF THE INVENTION

1. Field of the Invention

The present invention relates to a semiconductor device and a semiconductor module, and particularly, relates to a lead frame type semiconductor device and semiconductor module in which a comparatively large-sized semiconductor element is sealed with a resin. The present invention further relates to a method for manufacturing a semiconductor device, and to a lead frame, and particularly relates to a method for manufacturing a semiconductor device and a lead frame in which a lower surface of an island on which a large-sized discrete type semiconductor element is mounted is sealed with a resin.

2. Description of the Related Art

Semiconductor devices in which a semiconductor element that configures a power supply circuit and the like is sealed with a resin have been developed.

With reference to FIGS. 17A and 17B, a configuration of a semiconductor device 100 that is of this kind will be described. FIG. 17A is a plan view of the semiconductor device 100, and FIG. 17B is a sectional view taken along the line B-B' in FIG. 17A.

As shown in FIGS. 17A and 17B, the semiconductor device 100 includes a semiconductor element 104, an island 102 on which the semiconductor element 104 is mounted, lead 110s that are connected to the semiconductor element 104 and partially project to the outside, and an sealing resin 108 that covers and seals these components in an integrated manner.

The semiconductor element 104 is, for example, a discrete MOSFET. A drain electrode on a lower surface of the semiconductor element 104 is connected to the island 102, a gate electrode on a front surface thereof is connected to a lead 110A through a metal thin wire 106, and a source electrode on the front surface thereof is connected to a lead 110C through the metal thin wire 106.

Moreover, the leads 110A to 110C project from a side surface of the sealing resin 108. These leads 110 are inserted into a mounting board so that the semiconductor device 100 is fitted and mounted.

A method for manufacturing the semiconductor device 110 having the above-mentioned configuration is as follows. First, etching processing or press processing is performed on a conductive plate made of copper or the like and having a thickness of approximately 0.6 mm to form the island 102 and the leads 110 each having a predetermined shape. Then, the semiconductor element 104 is fixed on a front surface of the island 102, and electrodes on a front surface of the semiconductor element 104 are connected to the leads 110A and 110B through the metal thin wires 106. Thereafter, the island 102 and the semiconductor element 104 are accommodated in a cavity of a mold, and injection molding is performed by filling the cavity with the sealing resin 108. The semiconductor device 100 is manufactured in such a process.

Moreover, the above-mentioned process is performed with the leads 110 and the island 102 being connected to each other by a frame-like lead frame.

When the so-called power element in which switching is performed for large current is employed as the semiconductor element 104, a large amount of heat is discharged from the semiconductor element 104. In order to prevent the semiconductor device 100 from overheating due to this heat, a lower surface of the sealing resin 108 shown in FIG. 17B is brought into contact with a heat sink. In this case, a front surface of the sealing resin 108 is pressed downward by a pressing member such as a screw or the like, so that the lower surface of the sealing resin 108 is thermally coupled to the heat sink.

However, the above-mentioned semiconductor device 100 has a problem that the semiconductor element 104 could be destroyed by a pressing force of the screw that brings the semiconductor device 100 into contact with the heat sink.

Specifically, with reference to FIG. 17A, in order to achieve the semiconductor element 104 having low on resistance and high breakdown voltage, increasing the size of the semiconductor element 104 in a plane is effective. On the other hand, in order to implement miniaturization and weight reduction of the semiconductor device 100, a reduction in size the sealing resin 108 and the island 102 in planes is preferable. For that reason, the size of the semiconductor element 104 in the plane is a little smaller than those of the sealing resin 108 and the island 102. Namely, a portion used as an area for mounting the semiconductor element 104 accounts for a large percentage of the whole area of the semiconductor device 100.

Accordingly, when the front surface of the sealing resin 108 shown in FIG. 17B is pressed downward to bring the lower surface of the semiconductor device 100 into contact with a heat dissipating member such as a heat sink, the semiconductor element 104 is disposed under an area thus pressed. In other words, an area of the sealing resin 108 pressed by pressing member superimposes the area on which the semiconductor element 104 is placed. Therefore, this pressing force may apply large stress on the semiconductor element 104, resulting in breakage of the semiconductor element 104.

In addition, when a thickness of the sealing resin 108 that covers the semiconductor element 104 is made thinner in order to obtain a low profile semiconductor device, the above-mentioned problem is more likely to occur.

Furthermore, the above-mentioned method for manufacturing the semiconductor device has a problem that the lower surface of the island 102 is not sufficiently covered with the sealing resin 108.

Specifically, with reference to FIG. 17B, in order to efficiently discharge heat caused from the semiconductor element 104 to the outside while maintaining insulation of the island 102, it is important to make the sealing resin 108 to thinly cover the lower surface of the island 102.

However, as described above, the sealing resin 108 is formed by injection forming by use of a mold. Accordingly, if the sealing resin 108 for covering the lower surface of the island 102 is approximately 0.4 mm, for example, a space between the island 102 and an inner wall of the mold becomes very narrow, therefore making it very difficult to cause a liquefied sealing resin 108 to flow into this space. Accordingly, the space between the lower surface of the island 102 and the mold is not sufficiently filled with the sealing resin 108, leading to a problem that the island 102 is partially exposed to the outside from the sealing resin 108. Moreover, when a resin material filled with a particulate filler is employed as the sealing resin 108 in order to have improved heat dissipation properties, viscosity of the sealing resin 108 may increase, and the above-mentioned problem may frequently occur. Furthermore, when a large-sized discrete type transistor having low on resistance and high breakdown resistance is employed as the semiconductor element 104, an area of the island 102 also increases. Accordingly, there arises a problem that it is difficult to sufficiently cover the lower surface of the island 102 with the sealing resin 108.

SUMMARY OF THE INVENTION

The present invention has been made in consideration of the problems mentioned above. An object of the present invention is to provide a semiconductor device and a semiconductor module in which breakage of a semiconductor element due to a pressing force given from the outside is prevented. Other object of the present invention is to provide a method for manufacturing a semiconductor device and a lead frame that facilitate a sealing resin to flow into a lower surface of an island.

A semiconductor device according to one aspect of the present invention includes an island, a semiconductor element mounted on a main surface of the island, a sealing resin that seals the island and the semiconductor element in an integrated manner; a through-hole provided so as to penetrate the sealing resin in a thickness direction thereof; and a flat part obtained by flattening a main surface of the sealing resin at a periphery of the through-hole, in which the main surface of the sealing resin in a region overlapping the semiconductor element is depressed with respect to the flat part to form a depressed part.

One aspect of the present invention is a semiconductor module a semiconductor device and heat dissipating member that is in contact with the semiconductor device, in which the semiconductor device includes an island, a semiconductor element mounted on a main surface of the island, a sealing resin that seals the island and the semiconductor element in an integrated manner; a through-hole provided so as to penetrate the sealing resin in a thickness direction thereof; and a flat part obtained by flattening a main surface of the sealing resin at a periphery of the through-hole; the main surface of the sealing resin in a region overlapping the semiconductor element is depressed with respect to the flat part to form a depressed part; the semiconductor device is brought into contact with the heat dissipating member by pressing member that penetrates the through-hole of the semiconductor device and presses a main surface of the semiconductor device; and the pressing member is in contact with the flat part of the semiconductor device except the region overlapping the semiconductor element.

A method for manufacturing a semiconductor device according to one aspect of the present invention, the method comprising the steps of: preparing a lead frame that includes an island including a first main surface and a second main surface on the opposite side from the first main surface, and a lead having one end located close to the island, and an inclined surface located at a portion of a side surface of the island, the portion continuing to the second side surface; mounting a semiconductor element on the first main surface of the island, and electrically connecting an electrode of the semiconductor element to the lead; and sealing the island including the second main surface thereof, the semiconductor element, and the lead with a sealing resin by injection molding using a mold; in which in the sealing step, a liquefied or semi-solid sealing resin is injected into a cavity of the mold through a gate provided on a side of the island, and the sealing resin is caused to flow along the side surface of the island, the side surface being the inclined surface.

A lead frame according to one aspect of the present invention includes: an island including a first main surface on which a semiconductor element is mounted, and a second main surface on the opposite side from the first main surface; and a lead having one end located close to the island; in which a portion of a side surface of the island continuing to the second main surface is an inclined surface.

According to a semiconductor device and semiconductor module according to one aspect of the present invention, a main surface of a sealing resin has a part thereof pressed by pressing member depressed to form a depressed part. Moreover, this depressed part is formed in an area where the sealing resin superimposes a semiconductor element sealed with the sealing resin. This prevents pressing member such as a screw from pressing the main surface of the sealing resin that superimposes an area where the semiconductor element is disposed. As a result, a pressing force caused by the pressing member acting on the semiconductor element is suppressed, and breakage of the semiconductor element due to the pressing force is prevented.

According to one aspect of the present invention, by providing the sealing resin on the side surface of the island having an inclined surface from the gate provided in the mold, the sealing resin can be caused to flow along the inclined surface of the island to cover a lower surface of the island thinly. Accordingly, generation of a void in which the lower surface of the island is not partially covered by the sealing resin is prevented.

BRIEF DESCRIPTION OF THE DRAWINGS

FIG. 1A is a plan view thereof, and FIG. 1B is a sectional view thereof;

FIG. 2A is a plan view thereof, and FIG. 2B is a sectional view thereof;

FIG. 5A is a sectional view thereof, and FIG. 5B is a plan view thereof;

FIG. 8A is a plan view thereof, and FIG. 8B is an enlarged plan view thereof;

FIG. 9A is a plan view, FIG. 9B is a side view thereof, and FIG. 9C is a sectional view thereof;

FIG. 11A is a plan view thereof, and FIG. 11B is a sectional view thereof;

FIG. 12A is a sectional view thereof, and FIG. 12B is an enlarged sectional view thereof;

FIG. 15A is a plan view thereof, and FIG. 15B is a sectional view thereof;

FIG. 16A is a plan view thereof, and FIG. 16B is a sectional view thereof; FIG. 17A is a plan view thereof, and FIG. 17B is a sectional view thereof.

DESCRIPTION OF THE INVENTIONS

First Embodiment

In the present embodiment, description will be given on a semiconductor device and a method for manufacturing the semiconductor device in which a depressed part is provided in a sealing resin in order to prevent breakage of the semiconductor element due to an external force.

Figure 1A:
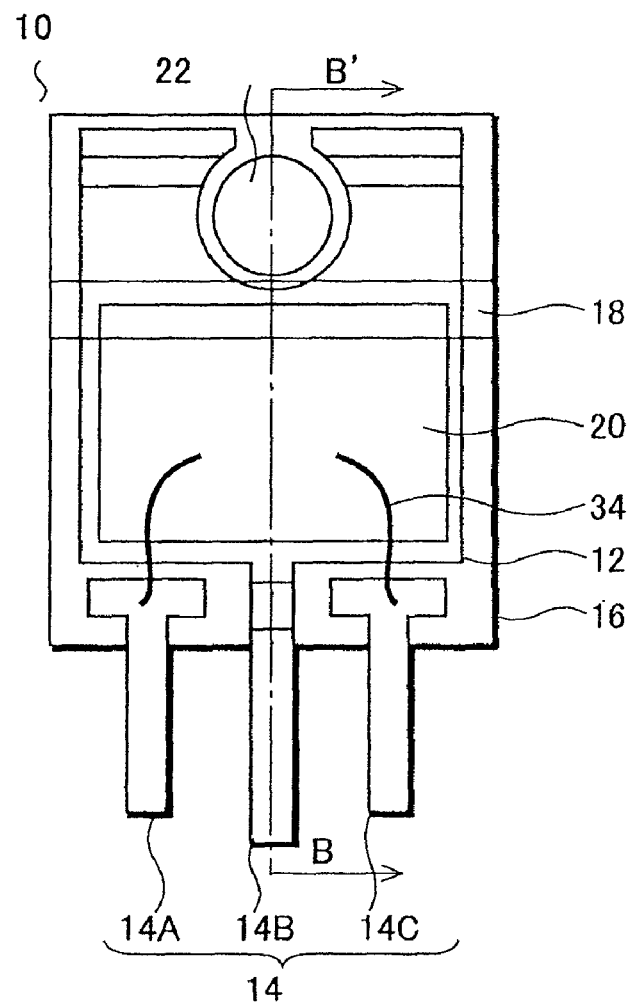
FIGS. 1A and 1B are drawings each showing a semiconductor device according to a preferred embodiment of the present invention.
Figure 1B:
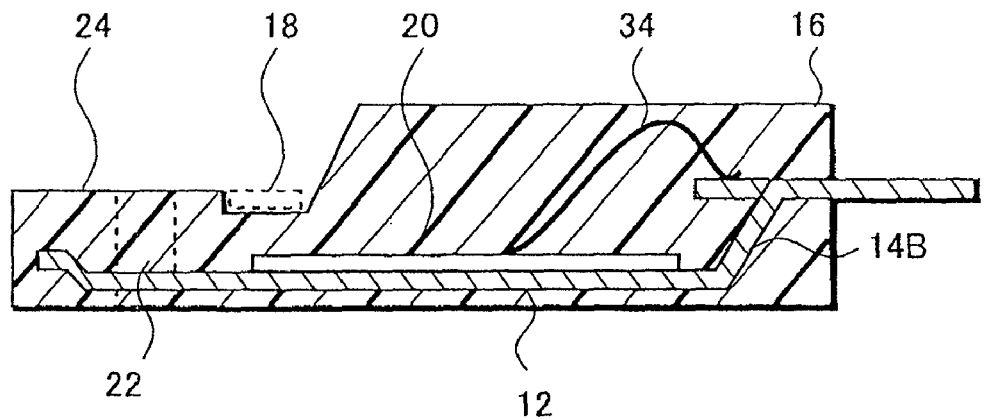

With reference to FIGS. 1A and 1B, a configuration of a semiconductor device 10 according to the present embodiment will be described. FIG. 1A is a plan view showing the semiconductor device 10, and FIG. 1B is a sectional view taken along the line B-B' in FIG. 1A.

As shown in FIGS. 1A and 1B, the semiconductor device 10 has a configuration mainly including an island 12, a semiconductor element 20 mounted on a front surface of the island 12, a lead 14 that functions as an external connection terminal, and a sealing resin 16 that covers these components in an integrated manner and mechanically supports them.

The island 12 is obtained by forming a conductive foil made of a metal such as copper and having a thickness of approximately 0.6 mm into a predetermined shape by etching processing or punching processing. The island 12 has a rectangular shape of a height and a width of approximately 12.0 mm and 14.0 mm for example, and has a cutout portion of a semicircular shape in a side of the upper side thereof in FIG. 1A. A through-hole for allowing a screw for fixation to pass therethrough is formed in the cutout portion having such a shape. From a central portion of a side on the bottom side in FIG. 1A of the island 12, a lead 14B extends continuing to the outside. With reference to FIG. 1B, in order to insulate the island 12 from the outside, a lower surface of the island 12 is covered with the sealing resin 16. Since a thickness of the sealing resin 16 that covers a lower surface of the island 12 is approximately 0.4 mm and is very thin, heat caused by operation of the semiconductor element 20 is sufficiently discharged to the outside through the island 12 and the thin sealing resin 16. Here, the lower surface of the island 12 does not always need to be covered with the sealing resin 16, but may be exposed from the sealing resin 16 for improvement in heat dissipation properties.

The leads 14 are electrically connected with a built-in semiconductor element 20. Each lead 14 is partially exposed to the outside, and functions as an external connection terminal. Moreover, at least one of the multiple leads 14 is bent. In other words, an intermediate part of the lead 14B in a center is bent, and leads 14A and 14C located on both sides of the lead 14B are flat without being bent. Here, portions of the leads 14A, 14B, and 14C projecting to the outside are located on the same plane. When the semiconductor device 10 is to be mounted on a mounting board or the like, end portions of the leads 14 are inserted into a hole provided in the mounting board so that the semiconductor device 10 is fitted and mounted.

The semiconductor element 20 is a semiconductor element including a main electrode on a lower surface thereof, and specifically, a metal-oxide semiconductor field effect transistor (MOSFET), a bipolar transistor, or an insulated gate bipolar translator (IGBT) is employed. Further, a semiconductor element that configures a power circuit is employed as the semiconductor element 20 in the present embodiment, for example, a power semiconductor element (power element) that performs switching for large current not less than 1 A is employed. As an example, when a MOSFET is employed as the semiconductor element 20, a drain electrode on a lower surface of the MOSFET is connected to the front surface of the island 12 through a conductive fixing material, a gate electrode on a front surface of the MOSFET is connected to the lead 14A through thin metal wires 34, and a source electrode on the front surface of the MOSFET is connected to the lead 14C through the thin metal wire 34. Then, on the basis of a control signal supplied from the lead 14A, the semiconductor element 20 performs switching operation for large current that flows in the lead 14B and the lead 14C. Here, a thickness of the semiconductor element 20 is, for example, approximately 20 μm to 400 μm.

Further, in order to implement low on resistance and high breakdown voltage, a larger plane size of the semiconductor element 20 is suitable. With reference to FIG. 1A, the semiconductor element 20 has a plane size of, for example, a height and a width of approximately 6 mm and 8 mm, and is a little smaller than the island 12 on which the semiconductor element 20 is placed.

The sealing resin 16 covers a part of each lead 14, the island 12, the semiconductor element 20, and the thin metal wire 34 in an integrated manner, and has a function to mechanically support these components as a whole. As a material of the sealing resin 16, thermosetting resins such as epoxy resins and thermoplastic resins such as acrylic resins may be employed. In order to have improved heat dissipation properties, the sealing resin 16 is made of a resin material to which a filler such as granular silica and alumina is added. Furthermore, a through-hole 22 is provided so as to penetrate the sealing resin 16 in a thickness direction thereof. This through-hole 22 is used as a hole for screwing a screw when the semiconductor device 10 is attached to a heat sink or the like. Additionally, in order to bring the lower surface of the sealing resin 16 into contact with a heat dissipating device such as the heat sink, the lower surface of the sealing resin 16 is entirely flat.

With reference to FIG. 1B, the through-hole 22 is provided so as to partially penetrate the sealing resin 16, and a periphery of a front surface of this through-hole 22 is a flat part 24. Then, a portion of the front surface of the sealing resin 16 continuing to the flat part 24 is depressed to form a depressed part 18.

The flat part 24 is a portion obtained by forming the front surface of the sealing resin 16 at a periphery of the through-hole 22 to be flat, and is a part with which pressing member such as a screw, a washer, etc. comes in contact. Since the semiconductor element 20 does not lay under this flat part 24, even when a pressing force caused by the pressing member acts on the flat part 24 from above, the pressing force does not act on the semiconductor element 20 so much.

A depth of the depressed part 18 depressed from the flat part 24 is, for example, approximately 0.2 mm. Referring to of FIG. 1A, this depressed part 18 is formed continuously from a left side of the semiconductor device 10 to a right side thereof. In addition, the depressed part 18 is provided so as to overlap an area on which the semiconductor element 20 is placed. The front surface of the sealing resin 16 that overlaps the semiconductor element 20 is partially depressed in this way to form the depressed part 18, and thus, stress given to the semiconductor element 20 by the pressing member such as a screw can be reduced. Details of this matter will be explained in full detail with reference to FIGS. 2A and 2B.

Further, the portions in which the flat part 24 and the depressed part 18 are provided are thinner than other portions. Thereby, this pressing member can be prevented from projecting upward even when the pressing member such as a screw presses the flat part 24, and a thickness of the whole device can be reduced. On the other hand, since the thin metal wire 34 formed in a loop shape needs to be covered with the sealing resin 16, a portion in which the thin metal wire 34 is formed is formed thicker than the portion in which the flat part 24 is formed.

Figure 2A:
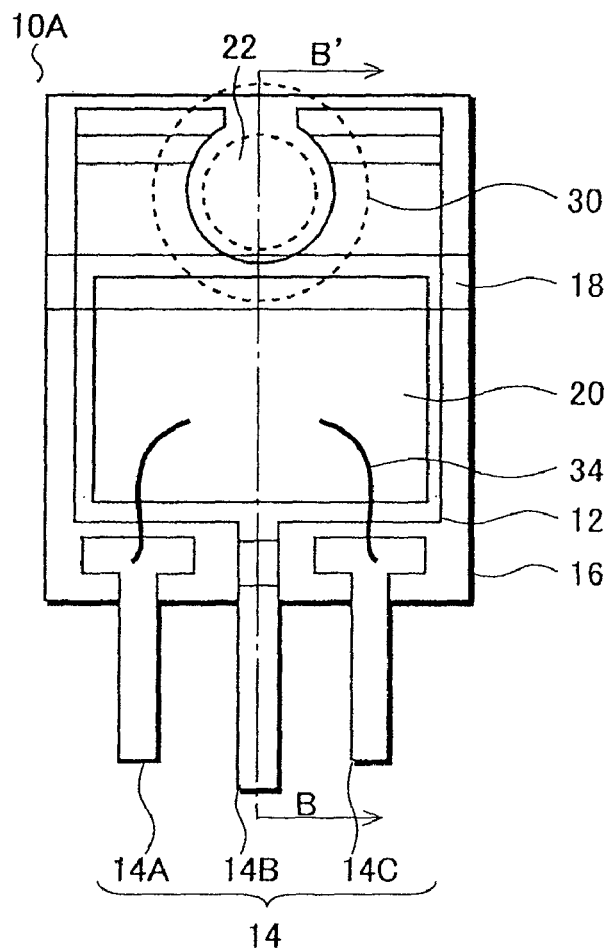
FIGS. 2A and 2B are drawings each showing a semiconductor module according to a preferred embodiment of the present invention.
Figure 2B:
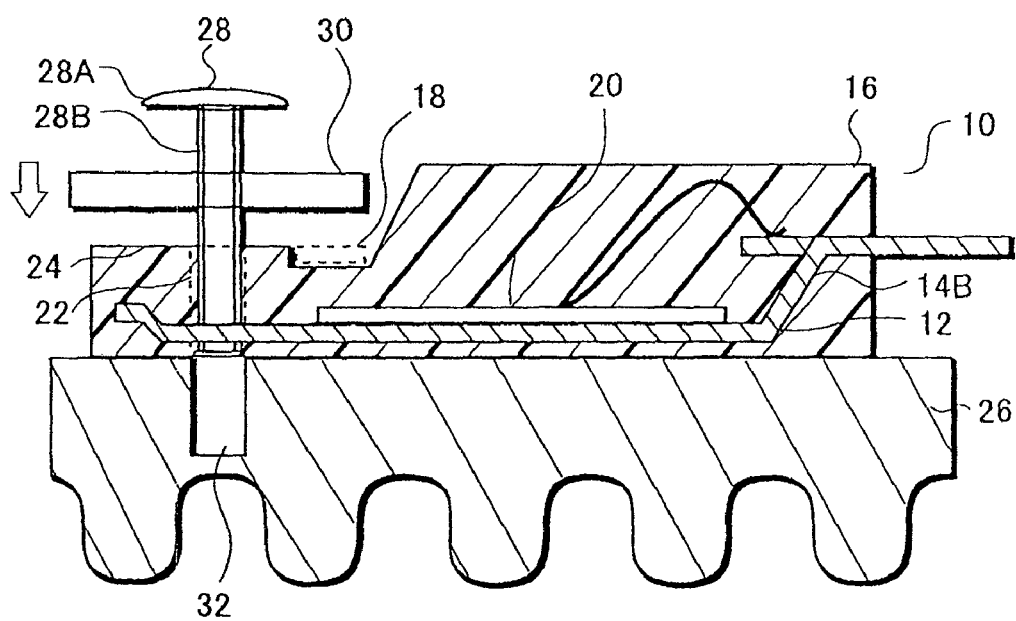

With reference to FIGS. 2A and 2B, next, description will be given on a configuration of a semiconductor module 10A into which the semiconductor device 10 having the above-mentioned configuration is incorporated. FIG. 2A is a plan view showing the semiconductor module 10A, and FIG. 2B is a sectional view taken along the line B-B' in FIG. 2A.

With reference to FIGS. 2A and 2B, the semiconductor module 10A has a configuration including the semiconductor device 10, a heat sink 26, a screw 28 (pressing member) that thermally couples the semiconductor device 10 to the heat sink 26 by pressing a circuit device.

With reference to FIG. 2B, the heat sink 26 is in planar contact with the lower surface of the semiconductor device 10, which is a flat surface of the sealing resin 16. The heat sink 26 is made of a metal such as copper or aluminum. The front surface of the heat sink 26 is flat in order to come into planar contact with the semiconductor device 10, and the lower surface of the heat sink 26 has an odd shape in order to have improved heat dissipation properties. Instead of the heat sink 26, it is also possible to employ a set of housing made of a metal as heat dissipating member.

A pore 32 is formed from the front surface of the heat sink 26, and a screw 28 penetrates this pore 32 and the through-hole 22 of the semiconductor device 10. The screw 28 includes a pillar-shaped pillar part 28B having a screw thread formed in a circumference of the pillar part 28B, and a head part 28A continuing to the pillar part 28B. Further, a circularly formed washer 30 made of a metal such as aluminum is interposed between the head part 28A of the screw 28 and the semiconductor device 10. In other words, while having the pillar part 28B threading the washer 30, the screw 28 penetrates the through-hole 22, and is screwed to the pore 32. Then, a front surface of the washer 30 comes into contact with the head 28A of the screw 28, and a lower surface of the washer 30 comes into contact with the flat part 24 of the semiconductor device 10. Accordingly, when the screw 28 is fixed to the heat sink 26, a pressing force given to the flat part 24 by the washer 30 brings the lower surface of the semiconductor device 10 into contact with the front surface of the heat sink 26.

With reference to FIG. 2A, an area in which the washer 30 is placed overlaps the semiconductor element 20. With such a disposition that the washer 30 overlaps the semiconductor element 20, the plane size of the semiconductor device 10 can be reduced. However, if the front surface of the sealing resin 16 is a simple flat surface and a pressing force is applied to the flat surface by the washer 30, the stress given to the semiconductor element 20 by this pressing force increases, and as a result, failures such cracks of the semiconductor element 20 may occur. In order to eliminate this, in the present embodiment, the front surface of the sealing resin 16 corresponding to an area in which the semiconductor element 20 is mounted and the washer 30 is disposed is partially depressed to form the depressed part 18. This configuration prevents the pressing force by the washer 30 from acting on the depressed part 18, and thus the stress acting on the semiconductor element 20 located under the depressed part 18 is also reduced.

Next, with reference FIG. 3 to FIG. 6, description will be given on a method for manufacturing a semiconductor device having a configuration described above.

Figure 3:
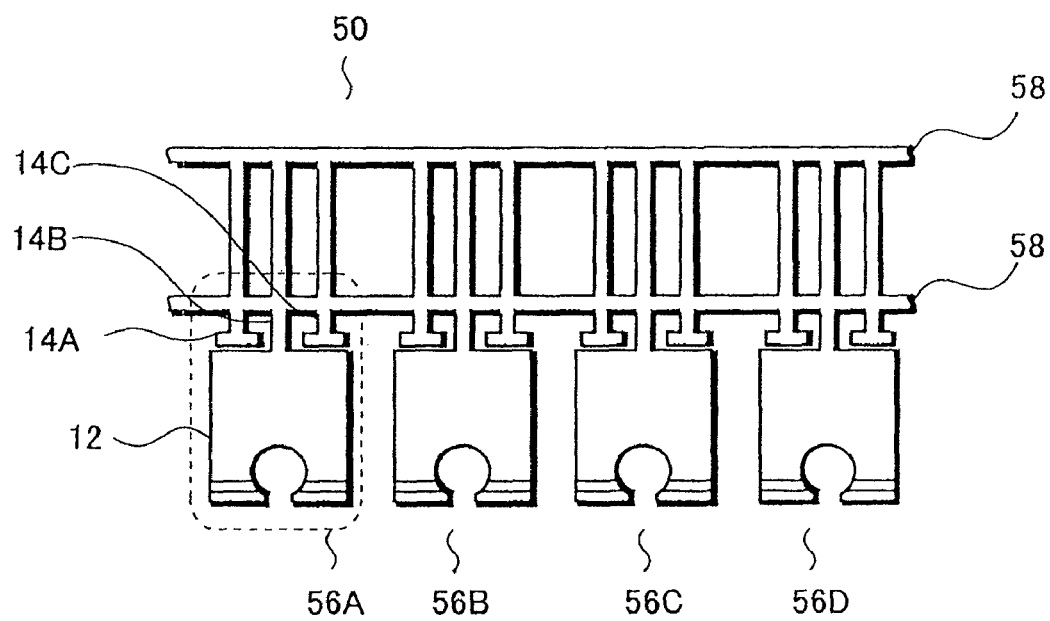
FIG. 3 is a plan view showing a method for manufacturing a semiconductor device according to a preferred embodiment of the present invention.

First, with reference to a plan view of FIG. 3, a lead frame 50 having a predetermined shape is prepared. The lead frame 50 is formed by etching processing or press processing, and multiple units each forming one semiconductor device are connected to the lead frame 50. Specifically, four units of units 56A to 56D are shown here. Each unit includes the island 12, the leads 14A and 14C each having one end located close to the island, and the lead 14B integrated with and extending from the island 12. The leads of the units are connected by tie bars 58.

Figure 4:
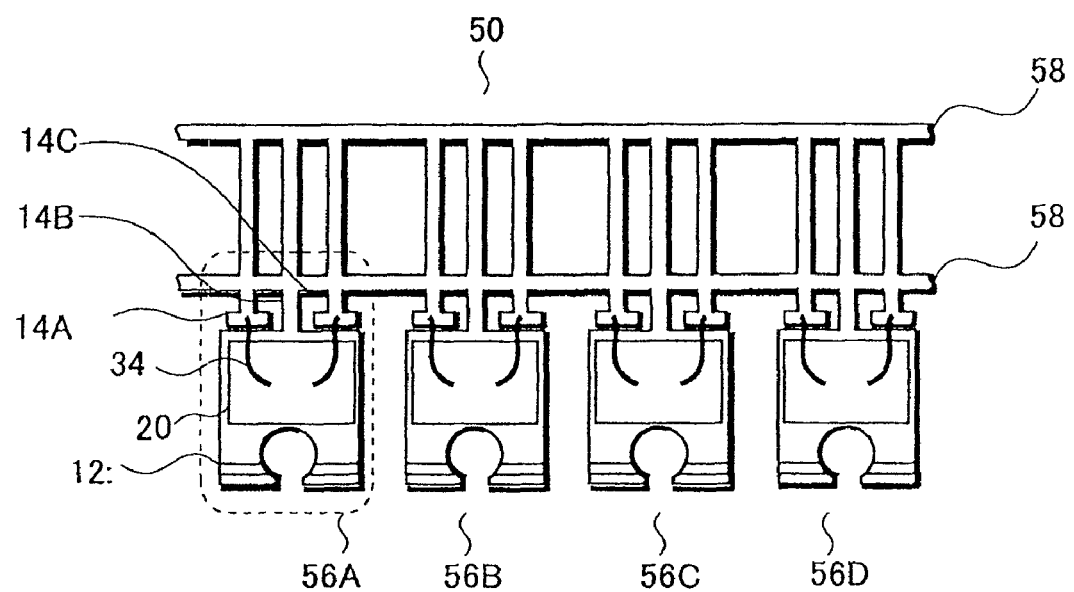
FIG. 4 is a plan view showing a method for manufacturing a semiconductor device according to a preferred embodiment of the present invention.

Next, with reference to FIG. 4, a semiconductor element is connected to each unit. Referring to the unit 56A, the semiconductor element 20 is mounted on the front surface of the island 12. As the semiconductor element 20, a discrete transistor such as a bipolar type transistor, MOSFET, or IGBT is employed. By using a conductive fixing material such as solder, or by eutectic bonding, an electrode on the lower surface of the semiconductor element 20 is connected to the front surface of the island 12. Moreover, an electrode on the front surface of the semiconductor element 20 is connected to the leads 14A and 14C through the metal thin wire 34.

Figure 5A:
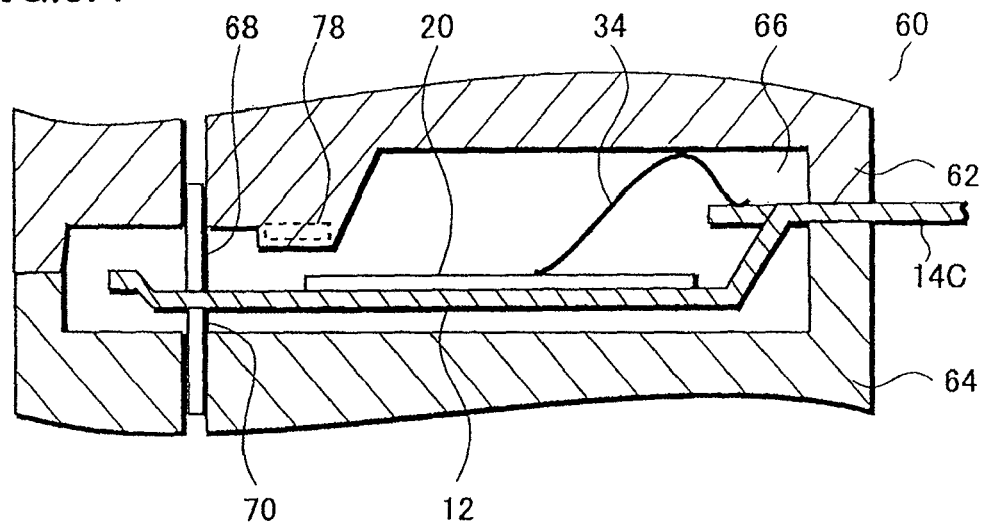
FIGS. 5A and 5B are plan views each showing a method for manufacturing a semiconductor device according to a preferred embodiment of the present invention.
Figure 5B:
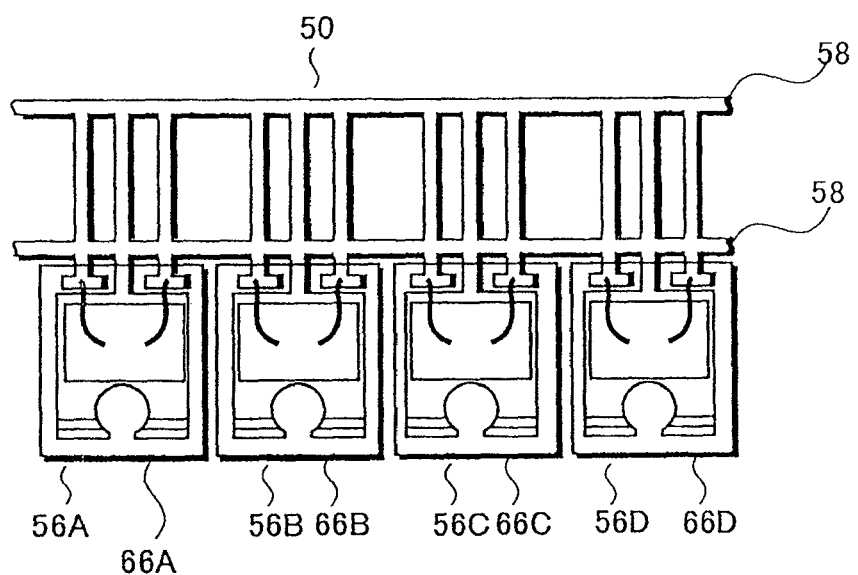

Next, with reference to FIGS. 5A and 5B, each unit is separately sealed with a resin. FIG. 5A is a sectional view of a mold 60 used in this process, and FIG. 5B is a plan view showing a state where one block 54 is accommodated in the mold.

With reference to FIG. 5A, transfer molding in which the sealing resin is injection molded using the mold 60 is performed in this process. Specifically, the mold 60 includes an upper mold 62 and a lower mold 64, and a cavity 66 is formed while the upper mold 62 and the lower mold 64 come into contact with each other. The cavity accommodates therein the island 12, the semiconductor element 20, and the thin metal wire 34. The sealing process with the resin is performed by injecting a liquefied or semi-solid sealing resin into the cavity 66 from a gate provided on a side surface of the cavity 66, and then heating and curing the resin. Meanwhile, the vicinity of an end of the island 12 is fixed in a thickness direction while having a front surface thereof pressed by a pressing part 68 and having a lower surface thereof pressed by a pressing part 70. The pressing part 68 is a movable pin provided in the upper mold 62. At an early stage of the resin sealing process, the pressing part 68 is in contact with the front surface of the island 12. As the resin sealing process proceeds, the pressing part 68 moves apart from the front surface of the island 12. Similarly, the pressing part 70 is a movable pin provided in the lower mold 64. At an early stage of the resin sealing process, an upper end of the pressing part 70 is in contact with the lower surface of the island 12. At an intermediate stage, the pressing part 70 moves apart from the lower surface of the island 12. By fixing a position of the island 12 in the thickness direction by the pressing part 68 and the pressing part 70 at an early stage of the resin sealing process, displacement or deformation of the island 12 by pressure that would otherwise occur while filling the resin is prevented. By moving the pressing part 68 and the pressing part 70 apart from the island 12 at an intermediate stage of the resin sealing process, the front surface and lower surface of the island 12 are covered with the sealing resin. As a result, pressure resistance and moisture resistance improve.

Further, the inner wall of the upper mold 62 partially projects downward to form a projecting part 78. The depressed part 18 shown in FIG. 1 is formed by providing this part.

With reference to FIG. 5B, the units 56A to 56D attached to the lead frame 50 are separately accommodated in the cavities 66A to 66D, and the above-mentioned resin sealing is performed.

Figure 6:
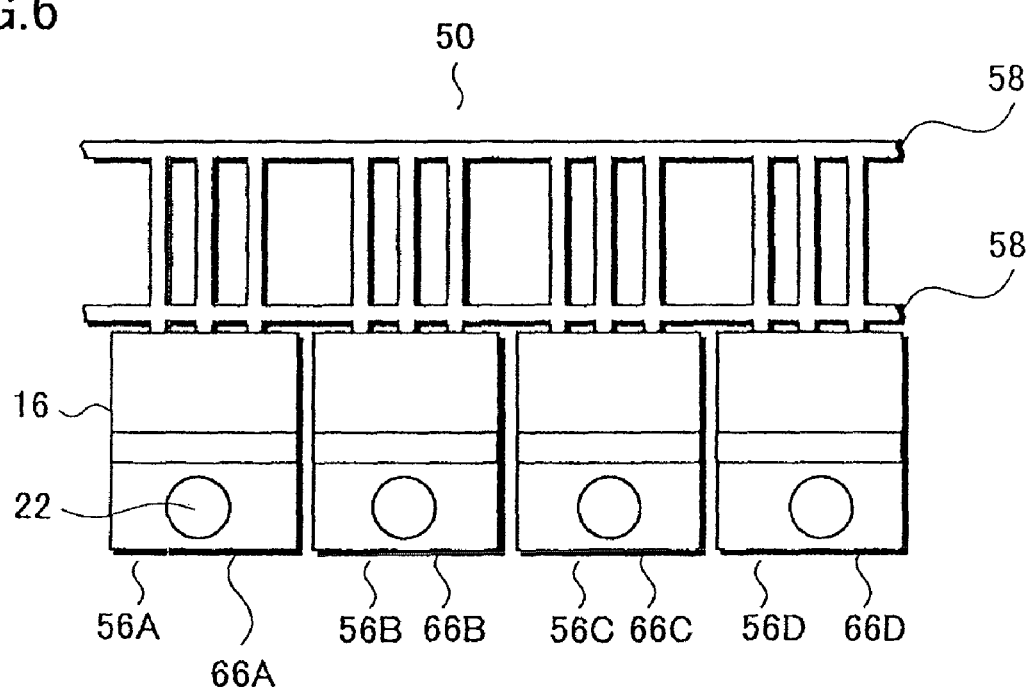
FIG. 6 is a plan view showing a method for manufacturing a semiconductor device according to a preferred embodiment of the present invention.

FIG. 6 shows the lead frame 50 after the resin sealing process is completed. Each unit is sealed with the sealing resin 16 in an integrated manner. After the resin sealing process is completed, a process of covering the leads with a plating film, a process of separating each unit from the lead frame 50, a process of measuring electrical properties of each unit, etc. are performed. Accordingly, a semiconductor device having a structure as shown in FIG. 1 is manufactured. When the semiconductor module shown in FIGS. 2A and 2B is manufactured, a main surface of the semiconductor device is caused to come into contact with the heat sink using the pressing member such as a screw and a washer so that the semiconductor device thermally couples to the heat sink.

Figure 7:
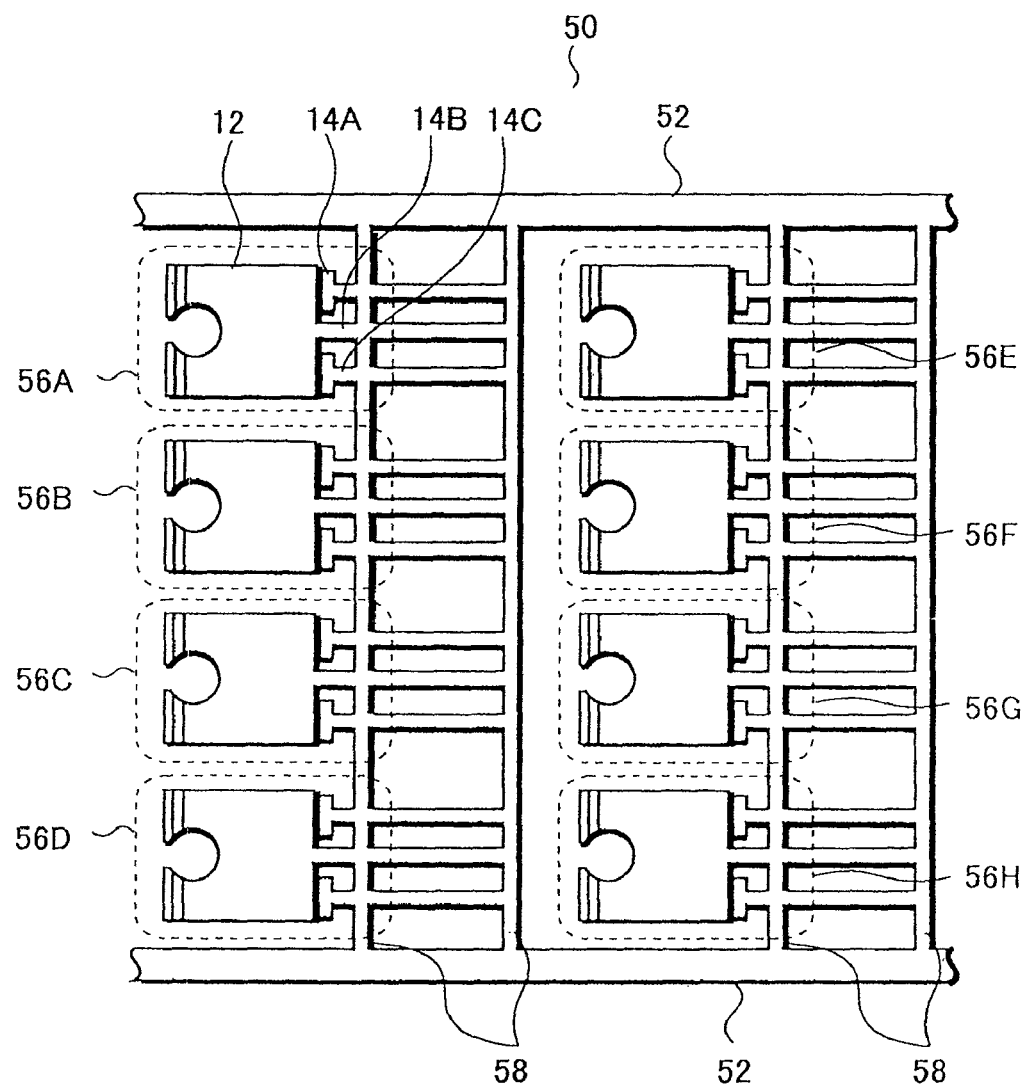
FIG. 7 is a diagram showing a method for manufacturing a semiconductor device according to a preferred embodiment of the present invention, and is a plan view showing a lead frame according to another embodiment.

With reference to FIG. 7, a shape of the lead frame 50 according to another embodiment used for the method for manufacturing the semiconductor device will be shown. Here, a frame-like outer frame 52 is provided, and tie bars 58 extend so as to continue to an upper outer frame 52 and a lower outer frame 52. Units 56A to 56D are arranged in a line on a left side in FIG. 7 and are connected to each other by tie bars 58 while units 56E to 56H are arranged in a line on a right side in FIG. 7 and are connected to each other by tie bars 58. Specifically, an intermediate part and end part of each of the leads 14A, 14B, and 14C of the unit 56A are connected to the tie bars 58. Similarly, the leads of other units 56B to 56H are also connected to the tie bars 58. In other words, in the lead frame 50 shown in FIG. 7, the units are arranged in a matrix form. Alternatively, here, the leads of the units adjacent to each other in a transverse direction may be arranged in a zigzag. In this case, for example, the leads 14A to 14C of the unit 56A and the leads 14A to 14C of the unit 56E are arranged in a zigzag facing to each other.

Second Embodiment

In the present embodiment, description will be given on a method for manufacturing a semiconductor device and a lead frame used therein, in which an island provided with an inclined side surface is sealed with a resin.

With reference to FIGS. 8A to 8B and FIGS. 9A to 9C, a configuration of a lead frame 50 according to the present embodiment will be described.

Figure 8A:
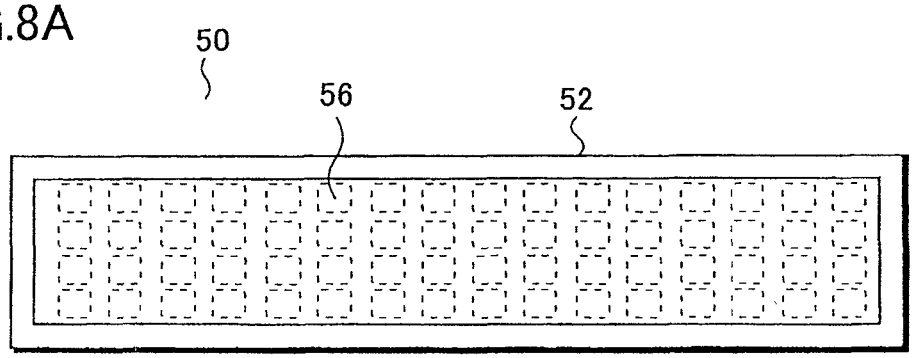
FIGS. 8A and 8B are drawings each showing a lead frame used for a method for manufacturing a semiconductor device according to a preferred embodiment of the present invention.
Figure 8B:
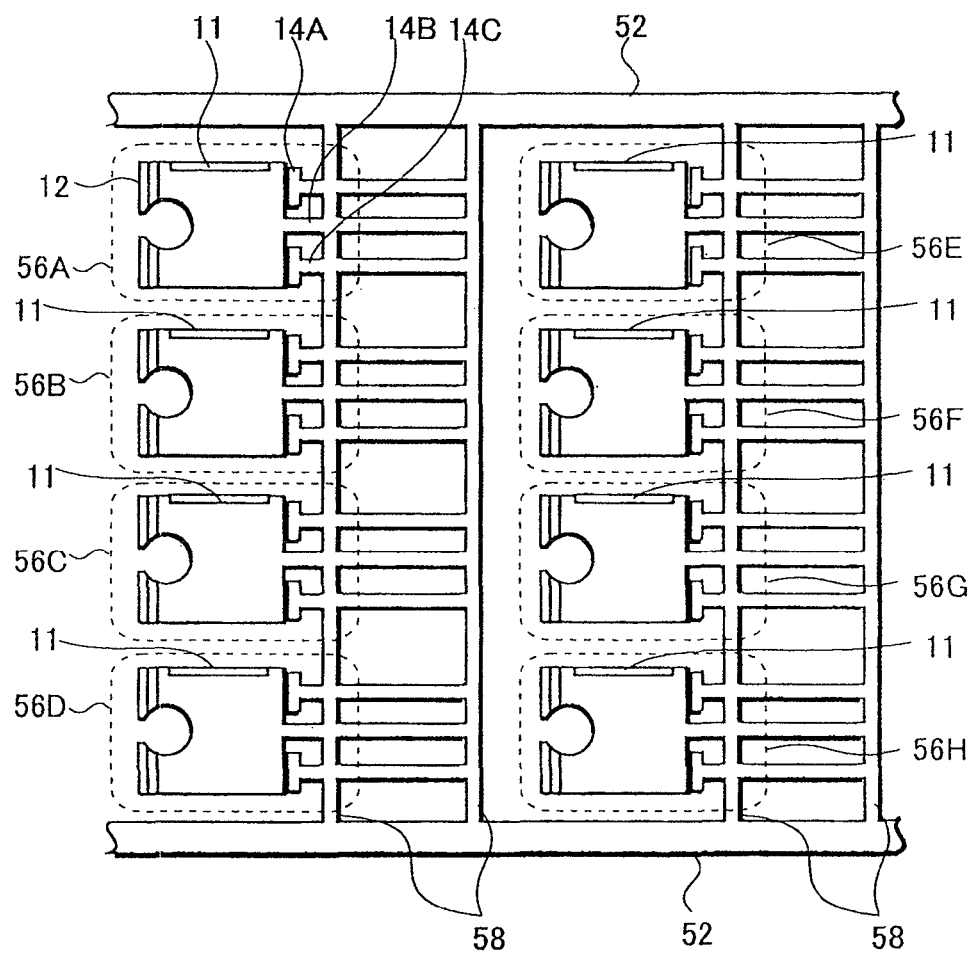

FIG. 8A is a plan view showing the lead frame 50 as a whole, and FIG. 8B is a partially enlarged plan view of the lead frame 50.

With reference to FIG. 8A, an outline of the lead frame 50 is rectangular, and multiple units 56 are formed within a frame-like outer frame 52 and arranged in a matrix form.

FIG. 8B is a plan view in which FIG. 8A is partially enlarged. Here, tie bars 58 extend to continue to an upper outer frame 52 and a lower outer frame 52. The units 56A to 56D are arranged in a line on a left side in FIG. 8B and are connected to each other by the tie bars 58, and the units 56E to 56H are arranged in a line on a right side in FIG. 8B and are connected to each other by the tie bars 58. Each unit includes an island 12 and leads 14A, 14B, and 14C. One end of each of the leads 14A and 14C is close to the island 12, while the lead 14B is integrated with and projects from the island 12. Each of the leads 14A, 14B, and 14C of the unit 56A has an intermediate part and end part connected to the tie bars 58. Similarly, the units 56B to 56D are also connected to the tie bars 58. The leads of the units 56E to 56H arranged in a line on the right side in FIG. 8B are also connected to each other by the tie bars 58. Here, the leads of the units adjacent to each other in a transverse direction may be arranged in a zigzag. In this case, for example, the leads 14A to 14C of the unit 56A and the leads 14A to 14C of the unit 56E are arranged in a zigzag facing to each other.

Furthermore, one side of the island 12 of each unit is partially inclined to form an inclined surface 11. This inclined surface 11 is provided for making resin sealing of each unit easy, and description thereof will be given in full detail with reference to FIGS. 9A to 9C, etc. In each unit, the inclined surface 11 is provided in an upper side of the island 12. This is for causing a liquefied sealing resin, which is supplied from above in FIGS. 9A to 9C, to flow under a lower surface of the island 12 (surface on which a semiconductor element is not mounted) in the resin sealing process.

Figure 9A:
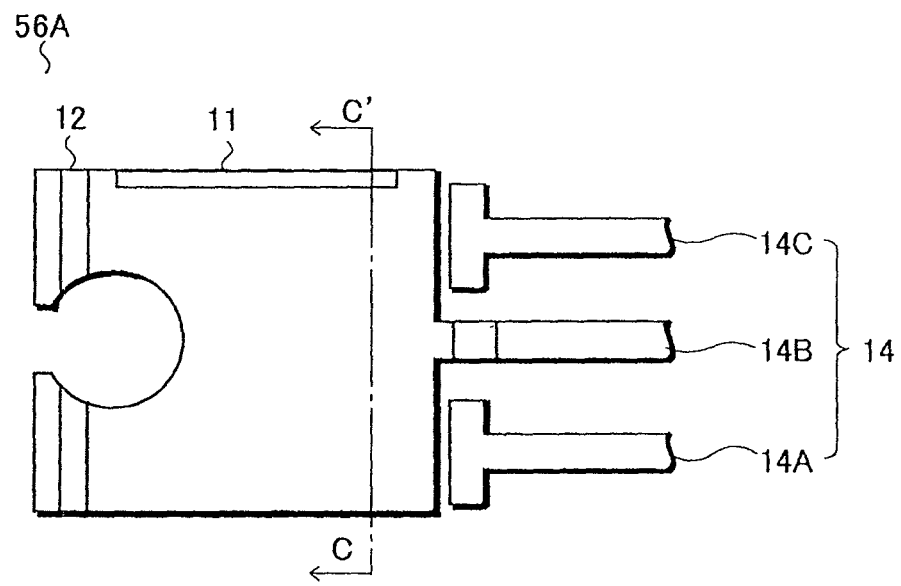
FIGS. 9A to 9C are drawings each showing a lead frame used for a method for manufacturing a semiconductor device according to a preferred embodiment of the present invention.

A shape of the unit 56A will be described with reference to FIGS. 9A to 9C. FIG. 9A is a plan view showing one unit 56A, FIG. 9B is a side view of the unit of FIG. 9A observed from above of FIG. 9A, and FIG. 9C is a sectional view taken along the line C-C' in FIG. 9A.

With reference to FIG. 9A, the unit 56A includes the island 12 having an approximately square shape, the leads 14A and 14C each having one end located close to the right side of the island 12, and the lead 14B integrated with and projecting from the right side of the island 12. On the left side of the island 12, a circular cutout portion is formed. This cutout portion is used to allow a screw for fixing the device to penetrate therethrough. The island 12 and the lead 14 are formed by performing etching processing or press processing on a conductive plate made of a metal such as copper and having a thickness of approximately 0.6 mm.

The inclined surface 11 is a portion in which the side surface of the island 12 is partially inclined. With reference to FIG. 9A, the inclined surface 11 is provided by partially inclining an upper side surface of the island 12 in FIG. 9A. This inclined surface 11 is provided to make the sealing resin flow easily in the resin sealing process as described above. Therefore the inclined surface 11 is provided facing a gate through which the sealing resin is injected in the resin sealing process. For that reason, the inclined surface 11 is provided on either the upper side surface of the island 12 or the lower side surface thereof. A left side surface of the island 12 has a circular cutout portion, and thus does not easily allow the sealing resin to be injected therefrom. Moreover, a right side surface of the island 12 has one end of each lead 14 located close thereto, and thus has difficulty in allowing the gate of the mold to be provided therein. Accordingly, it is preferable that the inclined surface 11 for facilitating resin sealing be provided on either the upper side of the island 12 or the lower side thereof.

Figure 9B:
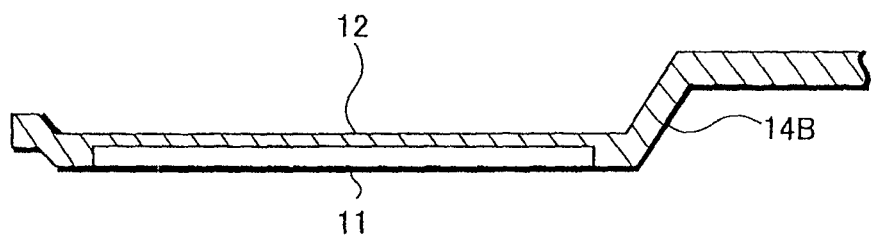
Figure 9C:
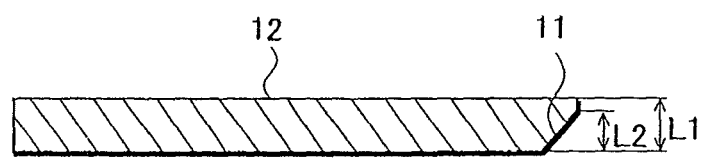

With reference to FIG. 9B and FIG. 9C, the inclined surface 11 is provided by inclining the side surface of the island 12 continuing to the lower surface of the island 12. With reference to FIG. 9C, the inclined surface 11 is formed by inclining a part of the side surface of the island 12, and another side surfaces are perpendicular to the main surface of the island 12. For example, when a thickness L1 of the island 12 is 0.6 mm, the inclined surface 11 is the side surface having a thickness of L2 (0.4 mm) from a lower end of the island 12. Thus, by forming the side surface of the island 12 as the inclined surface 11, a liquefied or semi-solid sealing resin can flow along the inclined surface 11 during the resin sealing process. Details of this matter will be described later as a part of a manufacturing process. The front surface of the island 12 is a surface on which a semiconductor element such as a discrete transistor is mounted. On the other hand, the semiconductor element is not mounted on the lower surface of the island 12, and the lower surface of the island 12 is thinly covered with the sealing resin that seals the whole semiconductor device.

With reference to FIG. 9C, the inclined surface 11 of the island 12 is the surface inclined straight, whereas the inclined surface 11 may be a curved surface that projects outward, or may be a curved surface that projects inward. When the inclined surface 11 is formed by wet etching, the inclined surface 11 has a curved surface that projects inward. When the inclined surface 11 is formed by punching, the inclined surface 11 has a curved surface that projects outward. Furthermore, the side surface of the island 12 may be entirely inclined to form the inclined surface 11.

With reference to FIG. 10 to FIG. 14, description will be given on a method for manufacturing a semiconductor having the above-mentioned configuration by using the lead frame 50. In the method for manufacturing a semiconductor device described below, each process will be performed on all the units included in the lead frame 50 shown in FIG. 10.

Figure 10:
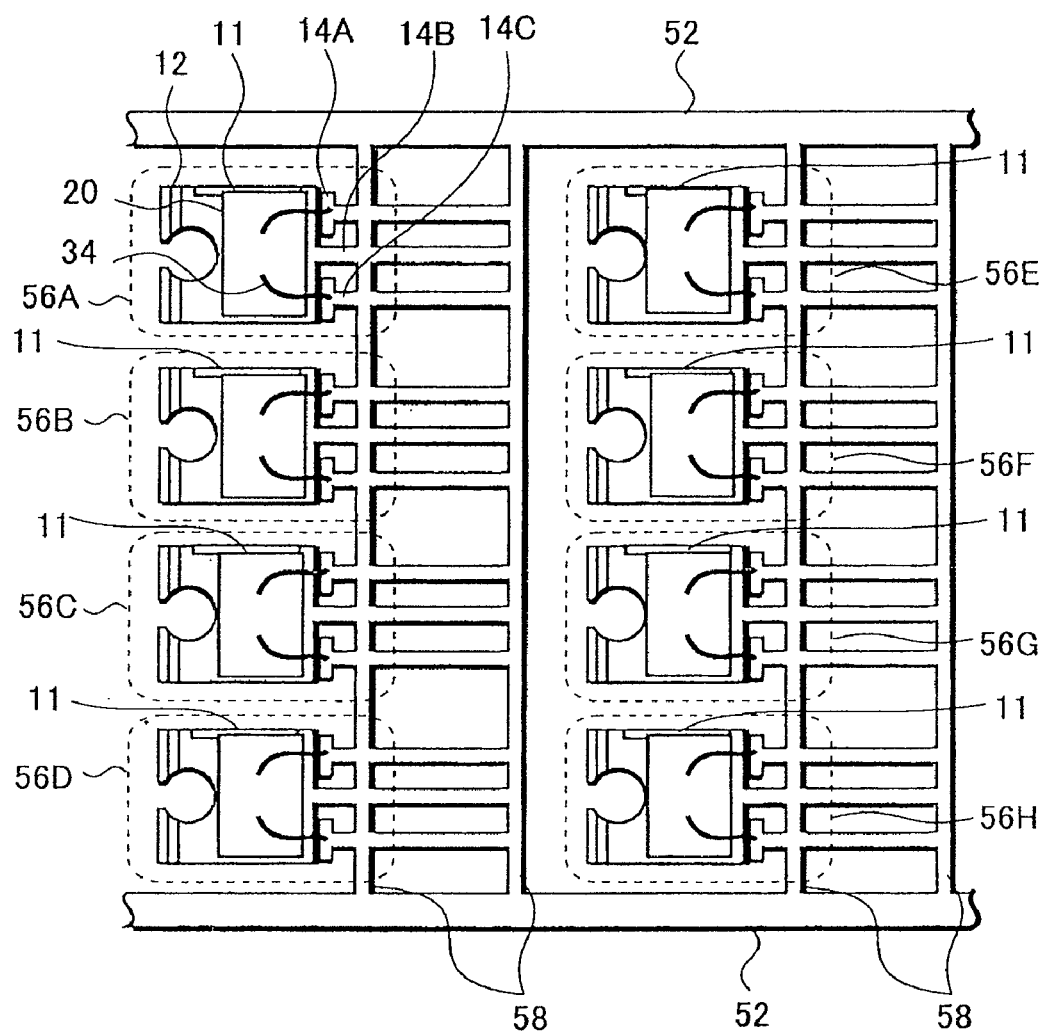
FIG. 10 is a plan view showing a method for manufacturing a semiconductor device according to a preferred embodiment of the present invention.

With reference to FIG. 10, the semiconductor element 20 is connected to each unit. Referring to the unit 56A, the semiconductor element 20 is mounted on the front surface of the island 12. As the semiconductor element 20, a discrete transistor such as a bipolar type transistor, MOSFET, or IGBT, is employed. By using a conductive fixing material such as solder or by eutectic bonding, an electrode on a lower surface of the semiconductor element 20 is electrically connected to the front surface of the island 12. Moreover, an electrode on the front surface of the semiconductor element 20 is connected to the lead 14A and the lead 14C through thin metal wires 34. Here, a plate-like metal connection plate made of a metal such as copper may be used instead of the thin metal wire 34.

Figure 11A:
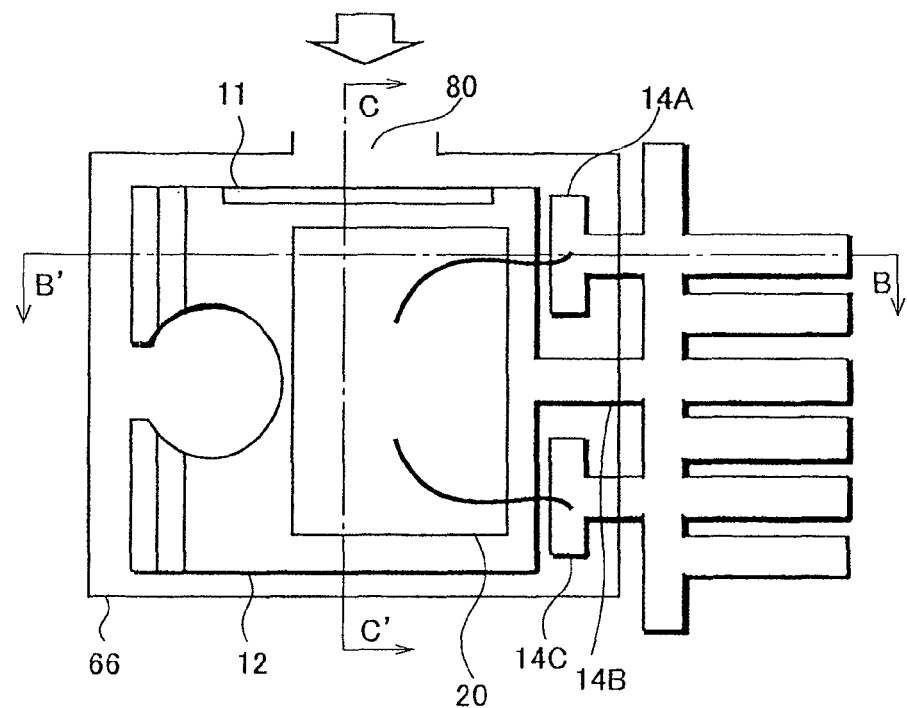
FIGS. 11A and 11B are diagrams each showing a method for manufacturing a semiconductor device according to a preferred embodiment of the present invention.
Figure 11B:
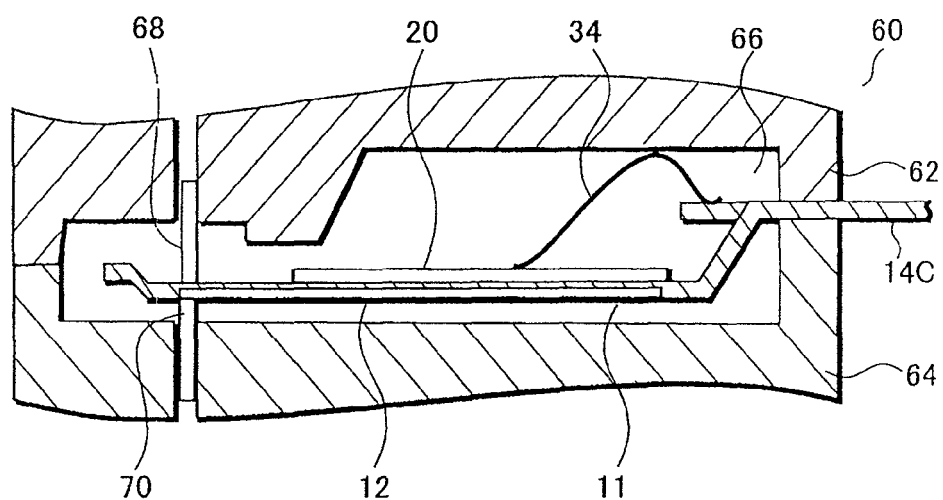

Next, with reference to FIGS. 11A and 11B, and FIGS. 12 to 14, each unit is separately sealed with a resin. FIG. 11A is a plan view showing this process, and FIG. 11B is a sectional view taken along the line B-B' in FIG. 11A.

With reference to FIG. 11A, in this process, each unit is separately accommodated to a cavity 66 to be injection molded. A single cavity 66 accommodates therein the island 12, the semiconductor element 20, and a part of each of the leads 14A, 14B, and 14C. The resin sealing process is performed by injecting a liquefied or semi-solid sealing resin into the cavity 66 through a gate 80 provided in a side surface of the cavity 66, and then heating and curing the sealing resin. Moreover, the inclined surface 11 is formed on the side surface, located close to the gate 80, of the island 12. Here, the inclined surface 11 is formed so as to have a width longer than that of the gate 80 and so as to overlap the gate 80 observed from a direction in which the sealing resin is injected through the gate 80. Thereby, a large portion of the sealing resin injected from the gate 80 can be caused to flow along the inclined surface 11.

With reference to FIG. 11B, transfer forming in which the sealing resin is injection molded using a mold 60 is performed in this process. Specifically, the mold 60 includes an upper mold 62 and a lower mold 64. The cavity 66 is formed while the upper mold 62 and the lower mold 64 come in contact with each other. The cavity 66 accommodates therein the island 12, the semiconductor element 20, and the thin metal wire 34.

Meanwhile, the vicinity of an end of the island 12 is fixed in a thickness direction while having a front surface thereof pressed by a pressing part 68 and having a lower surface thereof pressed by a pressing part 70. The pressing part 68 is a movable pin provided in the upper mold 62. At an early stage of the resin sealing process, the upper mold 62 is in contact with the front surface of the island 12. As the resin sealing process proceeds, the pressing part 68 moves apart from the front surface of the island 12. Similarly, the pressing part 70 is a movable pin provided in the lower mold 64. At an early stage of the resin sealing process, an upper end of the pressing part 70 is in contact with the lower surface of the island 12. At an intermediate stage, the pressing part 70 moves apart from the lower surface of the island 12. By fixing a position of the island 12 in the thickness direction by the pressing part 68 and the pressing part 70 at an early stage of the resin sealing process, displacement or deformation of the island 12 by pressure that would otherwise occur while filling the resin is prevented. Moreover, by moving the pressing part 68 and the pressing part 70 apart from the island 12 at an intermediate stage of the resin sealing process, the front surface and the lower surface of the island 12 are covered with the sealing resin. As a result, pressure resistance and moisture resistance improve.

Figure 12A:
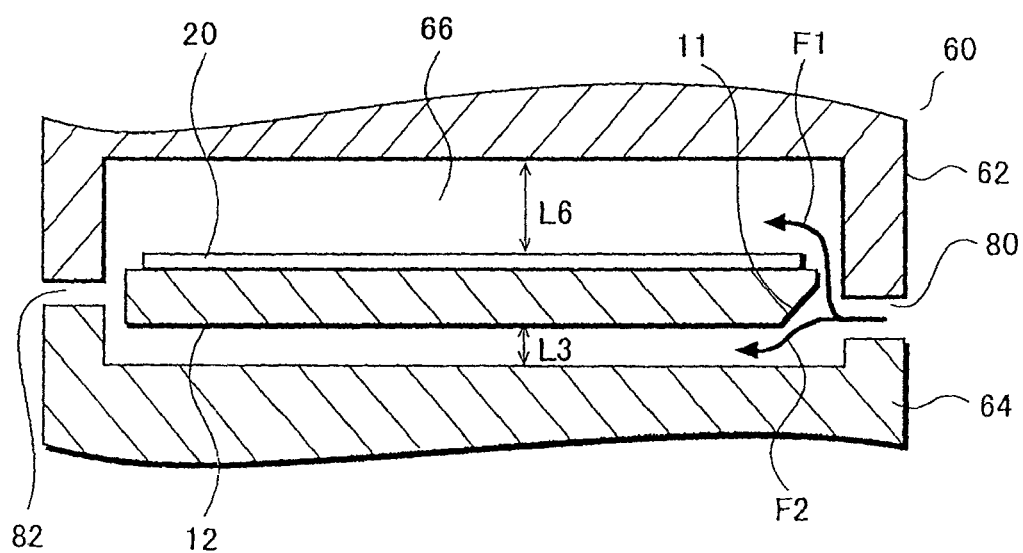
FIGS. 12A and 12B are diagrams each showing a method for manufacturing a semiconductor device according to a preferred embodiment of the present invention.
Figure 12B:
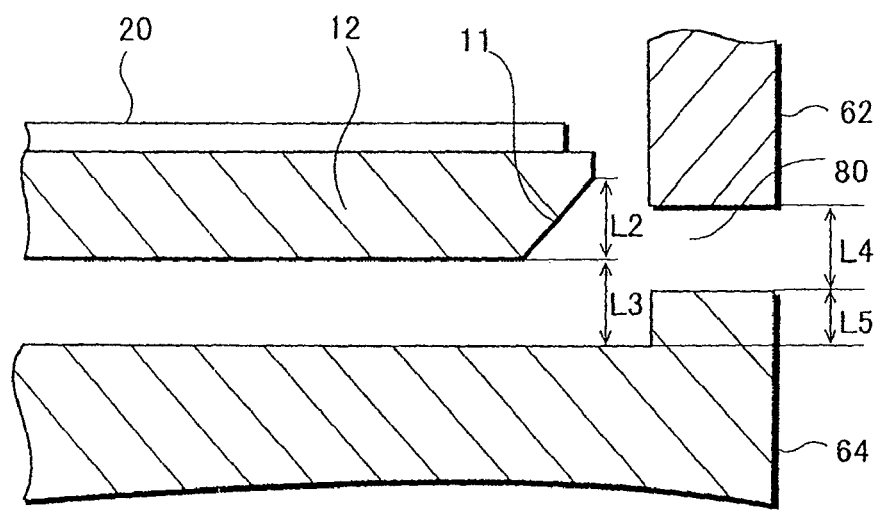

With reference to FIGS. 12A and 12B, the inclined surface 11 provided in the island 12 will be described. FIG. 12A is a sectional view taken along the line C-C' in FIG. 11A, and FIG. 12B is a partially enlarged view of FIG. 12A.

With reference to FIG. 12A, the gate 80 is provided at a right end of the mold 60, and an air vent 82 is provided at a left end which is opposite of the right end. In the resin sealing process, a liquefied or semi-solid sealing resin is injected into the cavity 66 through the gate 80, and air located within the cavity 66 is discharged to the outside through the air vent 82. Here, either a thermoplastic resin or a thermosetting resin is employed as the sealing resin, and a granular filler may be added to have improved heat dissipation properties.

With reference to FIG. 12B, the gate 80 of the mold is provided so as to face a side of the island 12. Specifically, a distance L5 from an inner wall bottom surface of the lower mold 64 to a lower end of the gate 80 is approximately 0.2 mm, and a width L4 in a vertical direction of the gate 80 is approximately 0.5 mm. Further, a distance L3 from the inner wall bottom surface of the lower mold 64 to the lower surface of the island 12 is approximately 0.3 mm, and a width L2 in a vertical direction of the inclined surface 11 is approximately 0.4 mm. Accordingly, the lower end of the gate 80 is located lower than the island 12, and an upper end of the gate 80 is located lower than an upper end of the inclined surface 11 of the island 12. Furthermore, here, the inclined surface 11 of the island 12 has a side which is closer to the lower surface of the island 12 and further from the gate 80.

Accordingly, as arrows shows in FIG. 12A, when the sealing resin is injected into the cavity 66 in a horizontal direction from the gate 80, the injected sealing resin comes into contact with a side surface of the island 12 and branches off. Here, F1 is a flow of the sealing resin that branches to a space above the island 12, and F2 is a flow of the sealing resin that branches to a space under the island 12. Here, a space under the island 12 within the cavity 66 is smaller than that above the island 12. As an example, a distance L6 between the front surface of the island 12 and a lower surface of an inner wall of the upper mold 62 is approximately 2 mm, and a distance L3 between the lower surface of the island 12 and the bottom surface of an inner wall of the lower mold 64 is approximately 0.3 mm.

In other words, the space under the island 12 is extremely narrower than the space above the island 12. For this reason, the space above the island 12 easily allows the sealing resin to flow therein than the space under the island 12 does. Accordingly, if the side surface of the island 12 is perpendicular to the main surface thereof, the sealing resin injected from the gate 80 is apt to flow preferentially into the space above the island 12. As a result, a sufficient amount of the sealing resin is not supplied to the space under the island 12, and a void in which the sealing resin is not filled may occur under the island 12. To prevent this, in the present embodiment, the side surface of the island 12 is formed as the inclined surface 11 so that the sealing resin supplied through the gate 80 comes into contact with this inclined surface 11. Thereby, the sealing resin coming into contact with the inclined surface 11 flows along the inclined surface 11, and is supplied preferentially to the lower surface of the island 12. As a result, the entire lower surface of the island 12 is covered with the sealing resin.

Figure 13:
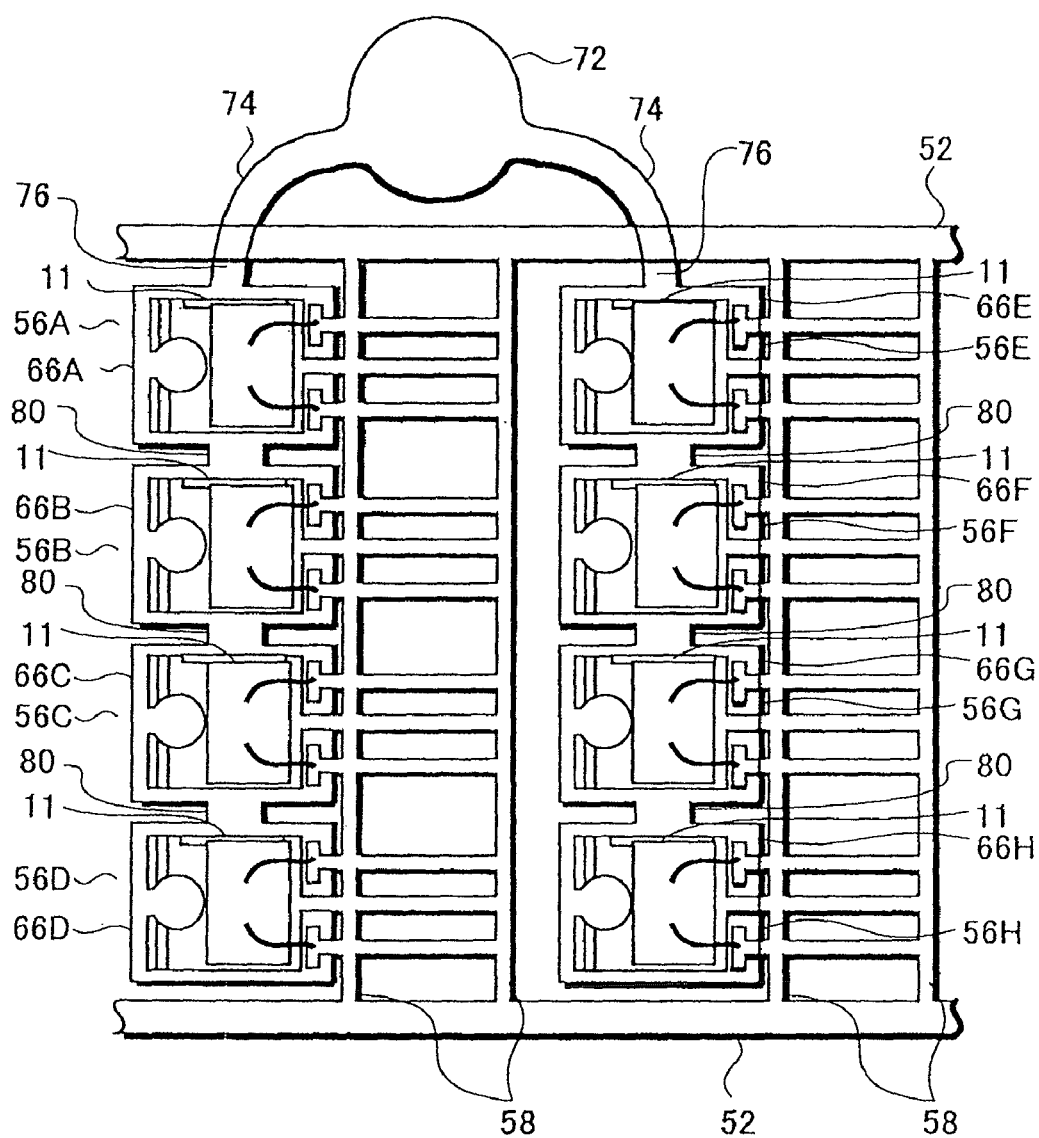
FIG. 13 is a plan view showing a method for manufacturing a semiconductor device according to a preferred embodiment of the present invention.

With reference to FIG. 13, in this process, the resin sealing process is collectively performed by supplying the sealing resin to multiple cavities from one pod 72. Specific description will be given as follows. Multiple units are provided in a longitudinal direction and arranged in two lines. The units 56A to 56D aligned in the longitudinal direction on the left side in FIG. 13 are separately accommodated in the cavities 66A to 66D respectively. Moreover, the cavities 66A to 66D are connected to each other through the gates 80. Accordingly, when a liquefied sealing resin is supplied to the cavity 66A through a runner 74 and a gate 76, the supplied sealing resin is caused to flow sequentially into the units 56A to 56D through the gates 80 each of which causes each two adjacent units to communicate with each other. Moreover, an unillustrated air vent is provided in the cavity 66D, and air corresponding in amount to the sealing resin supplied from the pod 72 is discharged to the outside through the air vent.

Similarly, the units 56E to 56H arranged in the longitudinal direction on the right side in FIG. 13 are also separately accommodated in the cavities 66E to 66H respectively, and the cavities 66E to 66H communicate with each other through the gates 80. Accordingly, the cavities 66E to 66H are sequentially filled with the sealing resin supplied through the runner 74 and the gate 76 from the pod 72.

As mentioned above, in this process, the sealing resin is collectively supplied from the single pod 72 to the multiple cavities 66 which respectively accommodate the units. Thereby, a configuration of the mold 60 is simplified and cost for resin sealing is reduced.

Further, in each cavity, the island 12 has the inclined surface located close to the gate 80. Accordingly, as shown in FIG. 12A, the sealing resin injected from the gate 80 flows along the inclined surface 11 provided in the island 12, and is filled preferentially into the space under the island 12.

Figure 14:
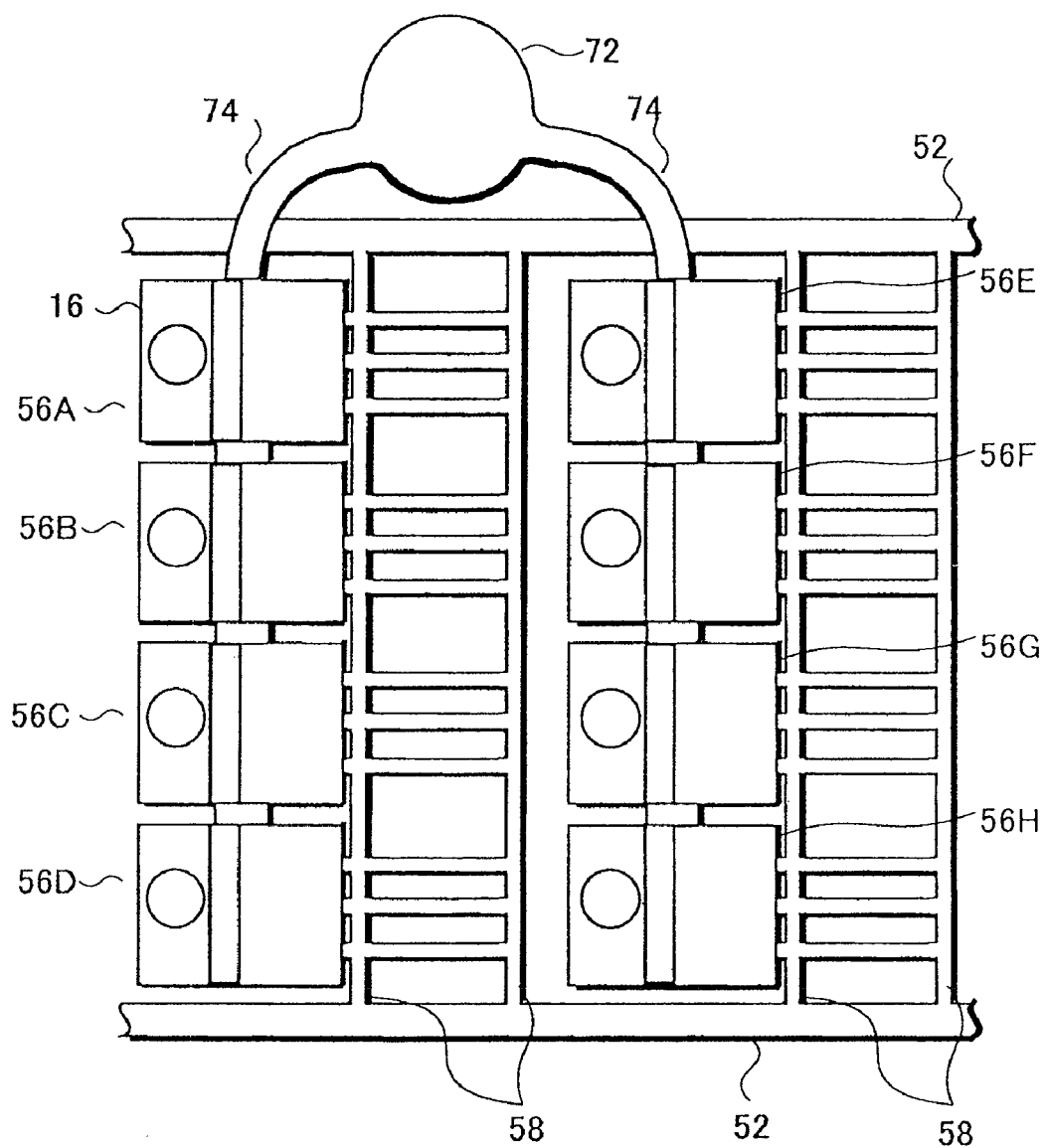
FIG. 14 is a plan view showing a method for manufacturing a semiconductor device according to a preferred embodiment of the present invention.
Figure 15A:
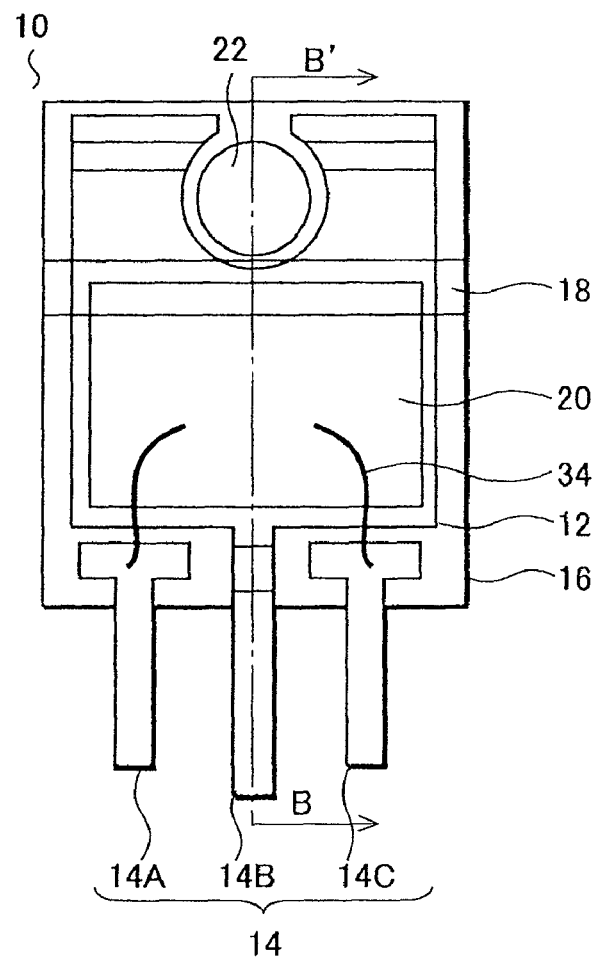
FIGS. 15A and 15B are drawings each showing a semiconductor device manufactured by a method for manufacturing a semiconductor device according to a preferred embodiment of the present invention.
Figure 15B:
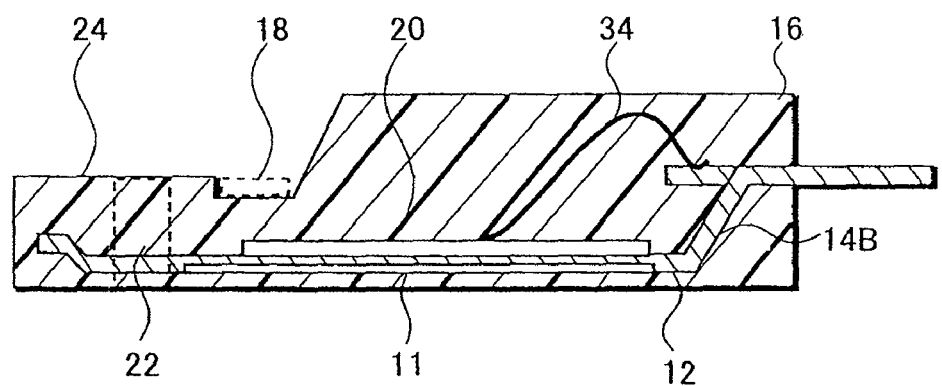
Figure 16A:
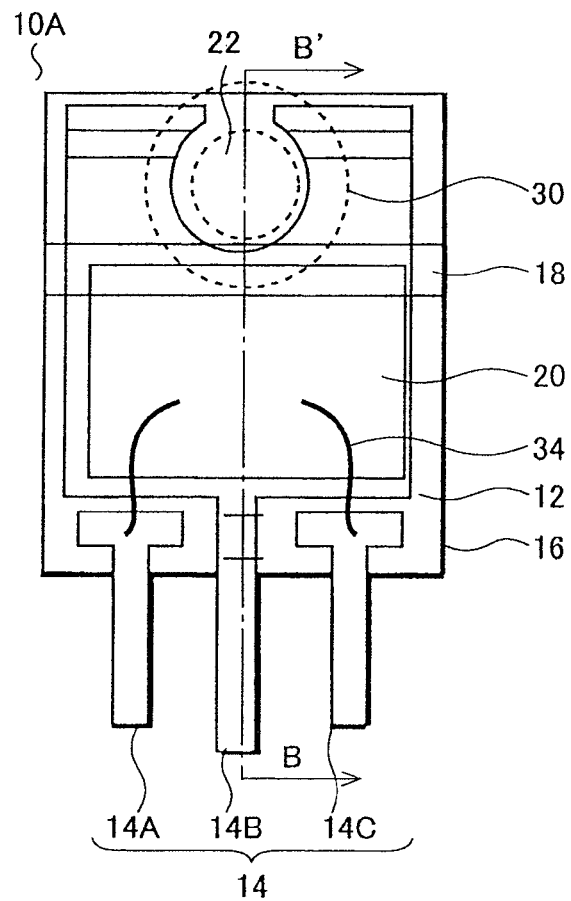
FIGS. 16A and 16B are drawings each showing a semiconductor module including a semiconductor device manufactured by a method for manufacturing a semiconductor device according to a preferred embodiment of the present invention.
Figure 16B:
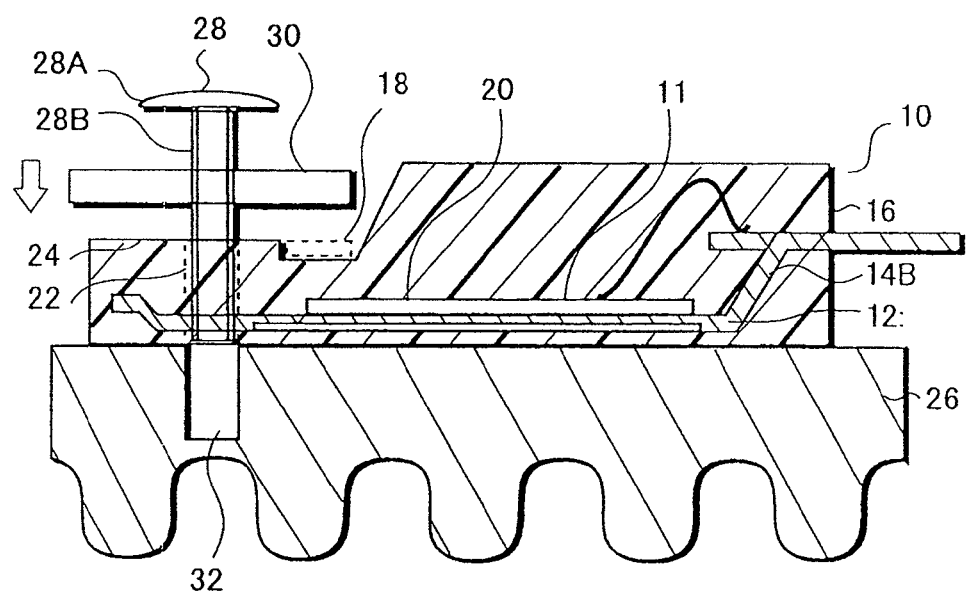
Figure 17A:
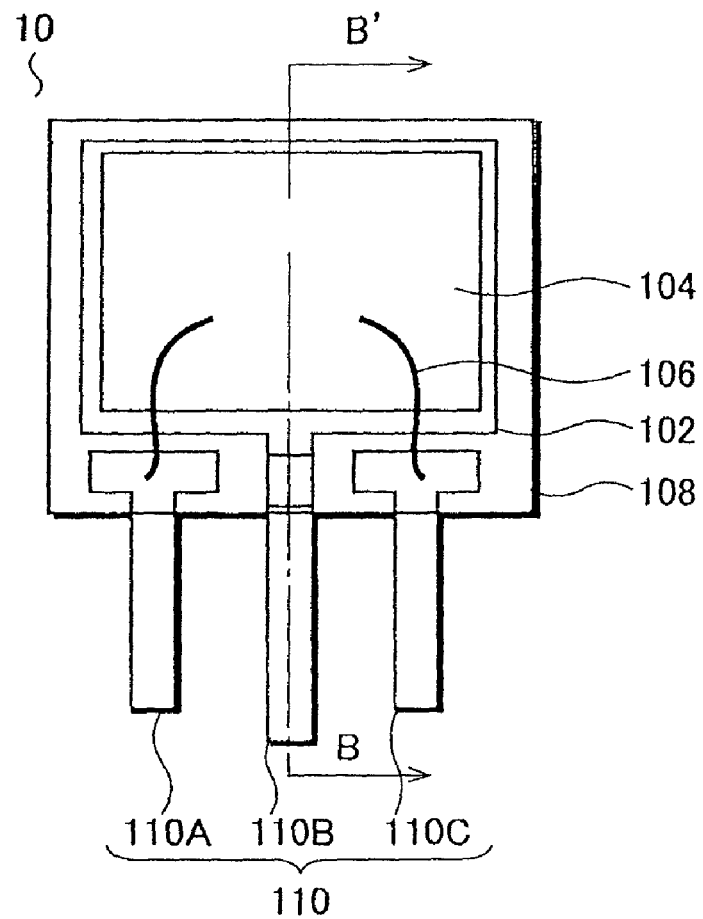
FIGS. 17A and 17B are drawings each showing a semiconductor device in the prior art.
Figure 17B:
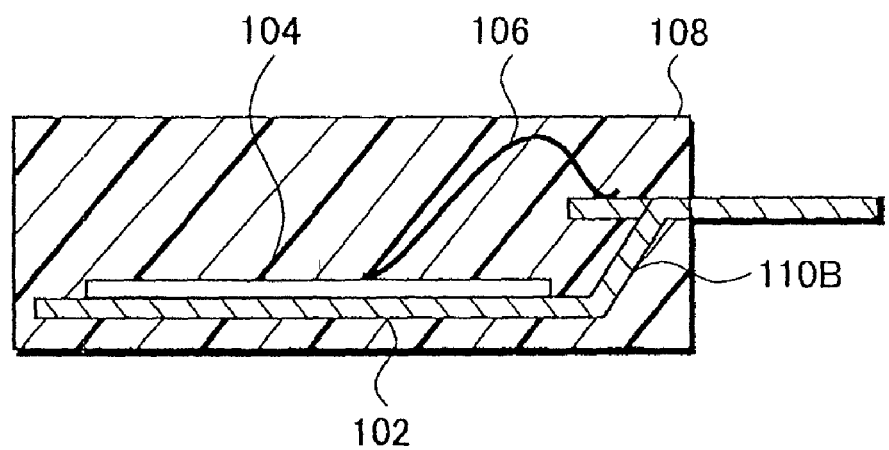

With reference to FIG. 14, the unit after the resin sealing process is completed will be shown. Each unit is sealed with the sealing resin 16 in an integrated manner. After resin sealing is completed, a process of covering the lead with a plating film, a process of separating each unit from the lead frame, a process of measuring electrical properties of each unit, etc. are performed. Thereby, a semiconductor device having the structure as shown in FIGS. 15A and 15B is manufactured. Meanwhile, when the semiconductor module shown in FIGS. 16A and 16B is manufactured, the main surface of the semiconductor device is caused to come into contact with the heat sink using the pressing member such as a screw and a washer so that the semiconductor device thermally couples to the heat sink.

With reference to FIGS. 15A and 15B, a configuration of the semiconductor device 10 manufactured by the above-mentioned manufacturing method will be described. FIG. 15A is a plan view showing the semiconductor device 10, and FIG. 15B is a sectional view taken along the line B-B' in FIG. 15A.

With reference to FIGS. 15A and 15B, the semiconductor device 10 has a configuration mainly including an island 12, a semiconductor element 20 mounted on a front surface of the island 12, an lead 14 that functions as an external connection terminal, and a sealing resin 16 that covers these components in an integrated manner and mechanically supports them.

The island 12 is obtained by forming a conductive foil made of a metal such as copper and having a thickness of approximately 0.6 mm into a predetermined shape by etching processing or punching processing. The island 12 has a rectangular shape of a height and a width of approximately 12.0 mm and 14.0 mm, for example, and has a cutout portion of a semicircular shape in a side of the upper side in FIG. 15A. In the cutout portion having such a shape, a through-hole for allowing a screw for fixation to path therethrough is formed. From a central portion of a lower side in FIG. 15A of the island 12, a lead 14B extends continuing to the outside. With reference to FIG. 15B, in order to insulate the island 12 from the outside, a lower surface of the island 12 is covered with the sealing resin 16. Since a thickness of the sealing resin 16 that covers a lower surface of the island 12 is approximately 0.3 mm to 0.4 mm and is very thin, heat caused by operation of the semiconductor element 20 is sufficiently discharged to the outside through the island 12 and the thin sealing resin 16.

The leads 14 are electrically connected with the built-in semiconductor element 20. Each lead 14 is partially exposed to the outside, and functions as an external connection terminal. Moreover, at least one of the multiple leads 14 is bent. In other words, an intermediate part of the lead 14B in a center is bent, and leads 14A and 14C located on both sides of the lead 14B are flat without being bent. Here, portions of the leads 14A, 14B, and 14C projecting to the outside are located on the same plane. When the semiconductor device 10 is to be mounted on a mounting board or the like, end portions of the leads 14 are inserted into a hole provided in the mounting board so that the semiconductor device 10 is fitted and mounted.

The semiconductor element 20 is a semiconductor element including a main electrode on a lower surface thereof, and specifically, a metal-oxide semiconductor field effect transistor (MOSFET), a bipolar transistor, or an insulated gate bipolar translator (IGBT) is employed. Further, a semiconductor element that configures a power circuit is employed as the semiconductor element 20 in the present embodiment, for example, a power semiconductor element (power element) that performs switching for large current not less than 1 A is employed. As an example, when a MOSFET is employed as the semiconductor element 20, a drain electrode on a lower surface of the MOSFET is connected to the front surface of the island 12 through a conductive fixing material, a gate electrode on a front surface of the MOSFET is connected to the lead 14A through thin metal wires 34, and a source electrode on the front surface of the MOSFET is connected to the lead 14C through the thin metal wires 34. Then, on the basis of a control signal supplied from the lead 14A, the semiconductor element 20 performs switching operation for large current that flows in the lead 14B and the lead 14C. Here, a thickness of the semiconductor element 20 is, for example, approximately 20 μm to 400 μm.

The sealing resin 16 covers a part of each lead 14, the island 12, the semiconductor element 20, and the thin metal wires 34 in an integrated manner, and has a function to mechanically support these components as a whole. As a material of the sealing resin 16, thermosetting resins such as epoxy resins and thermoplastic resins such as acrylic resins may be employed. In order to have improved heat dissipation properties, the sealing resin 16 is made of a resin material to which a filler such as granular silica and alumina is added. Furthermore, a through-hole 22 is provided so as to penetrate the sealing resin 16 in a thickness direction thereof. This through-hole 22 is used as a hole for screwing a screw when the semiconductor device 10 is attached to a heat sink or the like. Additionally, in order to bring the lower surface of the sealing resin 16 into contact with a heat dissipating device such as the heat sink, the lower surface of the sealing resin 16 is entirely flat.

With reference to FIG. 15B, the through-hole 22 is provided so as to partially penetrate the sealing resin 16, and a periphery of a front surface of this through-hole 22 is a flat part 24. Then, a portion of the front surface of the sealing resin 16 continuing to the flat part 24 is depressed to form a depressed part 18.

With reference to FIGS. 16A and 16B, next, description will be given on a configuration of a semiconductor module 10A into which the semiconductor device 10 having the above-mentioned configuration is incorporated. FIG. 16A is a plan view showing the semiconductor module 10A, and FIG. 16B is a sectional view taken along the line B-B' in FIG. 16A.

With reference to FIGS. 16A and 16B, the semiconductor module 10A has a configuration including the semiconductor device 10, a heat sink 26, a screw 28 (pressing omember) that thermally couples the semiconductor device 10 to the heat sink 26 by pressing a circuit device.

With reference to FIG. 16B, the heat sink 26 is in planar contact with the lower surface of the semiconductor device 10, which is a flat surface of the sealing resin 16. The heat sink 26 is made of a metal such as copper or aluminum. The front surface of the heat sink 26 is flat in order to come into planar contact with the semiconductor device 10, and the lower surface of the heat sink 26 has an odd shape in order to have improved heat dissipation properties. Instead of the heat sink 26, it is also possible to employ a set of housing made of a metal as the heat dissipating member.

A pore 32 is formed from the front surface of the heat sink 26, and a screw 28 penetrates this pore 32 and the through-hole 22 of the semiconductor device 10. The screw 28 includes a pillar-shaped pillar part 28B having a screw thread formed in a circumference of the pillar part 28B, and a head part 28A continuing to the pillar part 28B. Further, a circularly formed washer 30 made of a metal such as aluminum is interposed between the head part 28A of the screw 28 and the semiconductor device 10. In other words, while having the pillar part 28B threading the washer 30, the screw 28 penetrates the through-hole 22, and is screwed to the pore 32. Then, a front surface of the washer 30 comes into contact with the head 28A of the screw 28, and a lower surface of the washer 30 comes into contact with the flat part 24 of the semiconductor device 10. Accordingly, when the screw 28 is fixed to the heat sink 26, a pressing force given to the flat part 24 by the washer 30 brings the lower surface of the semiconductor device 10 into contact with the front surface of the heat sink 26.

What is claimed is:

1. A method of manufacturing a semiconductor device, the method comprising:
   providing a lead frame comprising an island having a first main surface and a second main surface opposite from the first main surface and a lead elongated in a first direction in plan view of the lead frame and having one end located close to the island;
   mounting a semiconductor element on the first main surface of the island;
   electrically connecting an electrode of the semiconductor element to the lead;
   placing the island, the semiconductor element mounted on the island and part of the lead in a cavity of a mold for injection molding; and
   injecting a liquefied or semi-solid sealing resin into the cavity of the mold through a gate having a lower end lower than the second main surface of the island so that the sealing resin flows under the island,
   wherein a side of the island has an inclined surface between the first main surface and the second main surface along a cross section of the lead frame, and
   the inclined surface faces the gate during the injection so that the sealing resin hits the inclined surface.

2. The method of claim 1, wherein the lead frame comprises units each including the island with the inclined side surface and the lead, and the units are arranged in a line so that the inclined side surfaces are aligned in the same direction, and
   during the injection molding, the units are separately accommodated in a plurality of cavities communicating with each other, and the sealing resin is sequentially supplied to the cavities arranged in the line from a pod provided in the mold.

3. The method of claim 1, wherein the inclined side surface is inclined such that an edge of the second main surface is further away from the gate than an edge of the first main surface.

4. The method of claim 1, wherein a space between the second main surface of the island and the mold is smaller than a space between the first main surface of the island and the mold.

5. The method of claim 1, wherein a position of the island within the cavity is fixed.

6. A lead frame, comprising:
   an island having a first main surface configured to receive a semiconductor element and a second main surface opposite from the first main surface; and
   a lead elongated in a first direction in plan view of the lead frame and having one end located close to the island,
   wherein the island has a first side running in the first direction,
   the first side of the island has an inclined surface between the first main surface and the second main surface in a cross-sectional view of the lead frame cut perpendicular to the first direction,
   the first side of the island defines part of an outer edge of the island in plan view of the lead frame, and
   the inclined surface of the island is not blocked by any lead of the lead frame.

7. The lead frame of claim 6, further comprising a plurality of units each including the island with the inclined side surface and the lead, wherein the units are arranged in a second direction.

* * * * *